US010249490B2

(12) United States Patent
Goel et al.

(10) Patent No.: US 10,249,490 B2
(45) Date of Patent: *Apr. 2, 2019

(54) NON-SILICON DEVICE HETEROLAYERS ON PATTERNED SILICON SUBSTRATE FOR CMOS BY COMBINATION OF SELECTIVE AND CONFORMAL EPITAXY

(71) Applicant: Intel Corporation, Santa Clara, CA (US)

(72) Inventors: Niti Goel, Portland, OR (US); Robert S. Chau, Beaverton, OR (US); Jack T. Kavalieros, Portland, OR (US); Benjamin Chu-Kung, Hillsboro, OR (US); Matthew V. Metz, Portland, OR (US); Niloy Mukherjee, Portland, OR (US); Nancy M. Zelick, Portland, OR (US); Gilbert Dewey, Hillsboro, OR (US); Willy Rachmady, Beaverton, OR (US); Marko Radosavljevic, Beaverton, OR (US); Van H. Le, Portland, OR (US); Ravi Pillarisetty, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/458,897

(22) Filed: Mar. 14, 2017

(65) Prior Publication Data
US 2017/0186598 A1  Jun. 29, 2017

Related U.S. Application Data

(63) Continuation of application No. 14/915,185, filed as application No. PCT/US2013/062453 on Sep. 27, 2013, now Pat. No. 9,640,537.

(51) Int. Cl.
*H01L 21/02* (2006.01)
*H01L 29/78* (2006.01)
(Continued)

(52) U.S. Cl.
CPC .... *H01L 21/0245* (2013.01); *H01L 21/02532* (2013.01); *H01L 21/02546* (2013.01);
(Continued)

(58) Field of Classification Search
CPC ............ H01L 29/7853–29/7854; H01L 29/16–29/1608; H01L 21/823821;
(Continued)

(56) References Cited

U.S. PATENT DOCUMENTS

2010/0252816 A1    10/2010  Ko et al.
2010/0301390 A1*   12/2010  Ko .................. H01L 29/7851
                                                          257/190
(Continued)

FOREIGN PATENT DOCUMENTS

CN  101853882   10/2010
CN  103311296    9/2013
(Continued)

OTHER PUBLICATIONS

Maszara, W.P. and M. R. Lin, "FinFETs—Technology and Circuit Design Challenges," IEEE, 2013, pp. 3-8.
(Continued)

Primary Examiner — Kevin M Picardat
(74) Attorney, Agent, or Firm — Schwabe, Williamson & Wyatt, P.C.

(57) ABSTRACT

A single fin or a pair of co-integrated n- and p-type single crystal electronic device fins are epitaxially grown from a substrate surface at a bottom of one or a pair of trenches formed between shallow trench isolation (STI) regions. The fin or fins are patterned and the STI regions are etched to
(Continued)

form a height of the fin or fins extending above etched top surfaces of the STI regions. The fin heights may be at least 1.5 times their width. The exposed sidewall surfaces and a top surface of each fin is epitaxially clad with one or more conformal epitaxial materials to form device layers on the fin. Prior to growing the fins, a blanket buffer epitaxial material may be grown from the substrate surface; and the fins grown in STI trenches formed above the blanket layer. Such formation of fins reduces defects from material interface lattice mismatches.

20 Claims, 19 Drawing Sheets

(51) Int. Cl.
H01L 29/66 (2006.01)
H01L 21/8238 (2006.01)
H01L 21/8252 (2006.01)
H01L 27/092 (2006.01)
H01L 29/06 (2006.01)
H01L 29/165 (2006.01)
H01L 29/205 (2006.01)
H01L 29/10 (2006.01)
H01L 29/16 (2006.01)
H01L 29/20 (2006.01)

(52) U.S. Cl.
CPC .... *H01L 21/02598* (2013.01); *H01L 21/8252* (2013.01); *H01L 21/823807* (2013.01); *H01L 21/823821* (2013.01); *H01L 21/823878* (2013.01); *H01L 27/0922* (2013.01); *H01L 27/0924* (2013.01); *H01L 29/0649* (2013.01); *H01L 29/1054* (2013.01); *H01L 29/16* (2013.01); *H01L 29/165* (2013.01); *H01L 29/20* (2013.01); *H01L 29/205* (2013.01); *H01L 29/66795* (2013.01); *H01L 29/785* (2013.01); *H01L 21/02381* (2013.01); *H01L 21/02461* (2013.01); *H01L 21/02463* (2013.01); *H01L 21/02502* (2013.01); *H01L 21/02543* (2013.01); *H01L 21/02639* (2013.01); *H01L 21/02647* (2013.01)

(58) Field of Classification Search
CPC . H01L 27/0924; H01L 29/00; H01L 29/1054; H01L 29/0649; H01L 29/20; H01L 21/823807; H01L 21/823878; H01L 29/785–29/7856; H01L 21/823431
USPC ........................................................ 257/192
See application file for complete search history.

(56) References Cited

U.S. PATENT DOCUMENTS

| 2011/0156004 | A1 | 6/2011 | Radosavljevic et al. |
| 2013/0056795 | A1 | 3/2013 | Wu et al. |
| 2013/0075729 | A1 | 3/2013 | Xia et al. |
| 2013/0089958 | A1 | 4/2013 | Yeh et al. |
| 2013/0119347 | A1* | 5/2013 | Cho .................. H01L 29/66462 257/24 |
| 2013/0234147 | A1* | 9/2013 | Wu .................... H01L 29/66795 257/76 |
| 2014/0170839 | A1 | 6/2014 | Brunco |
| 2014/0374807 | A1 | 12/2014 | Jacob |

FOREIGN PATENT DOCUMENTS

| JP | 2011/146684 | 7/2011 |
| TW | 201104866 | 2/2011 |

OTHER PUBLICATIONS

Office Action and Search Report for European Application No. 13892844.5, dated Mar. 28, 2017, 1 page.
Extended European Search Report for European Application No. 13894917.7, dated Apr. 5, 2017, 8 pages.
Office Action for European Application No. 13894917.7, dated Apr. 24, 2017, 1 page.
International Search Report dated Jun. 27, 2014 for Application No. PCT/US2013/062453.
Intel Corporation, International Preliminary Report on Patentabilty for PCT/US2013/062453 dated Apr. 7, 2016.
Intel Corporation, Office Action and Search Report for Taiwan Application No. 103133279 with English Translation.
Office Action for Chinese Patent Application No. 201380079155.2, dated May, 4, 2018, 7 pages.
Office Action from Taiwan Patent Application No. 103133279, dated Mar. 16, 2016, 22 pages (including English Translation).
Notice of Allowance from Taiwan Patent Application No. 103133279, dated Sep. 19, 2016, 2 page.
Office Action for Taiwan Patent Application No. 105113716, dated Jul. 18, 2017, 35 pages (including English Translation).
Office Action for Taiwan Patent Application No. 105113716, dated Feb. 26, 2018, 41 pages (including English Translation).
Xiao, Hong, "Introduction to Semiconductor Manufacturing Technology," Austin Community College, Prentice Hall, 2001, 3 pages.
Communication Pursuant to Article 94(3) EPC from European Patent Application No. 13894917.7 dated Sep. 20, 2018, 4 pages.
Office Action for Chinese Patent Application No. 201380079155.2, dated Dec. 3. 2018, 6 pages.

* cited by examiner

NON-SILICON DEVICE HETEROLAYERS ON PATTERNED SILICON SUBSTRATE FOR CMOS BY COMBINATION OF SELECTIVE AND CONFORMAL EPITAXY

This is a Continuation of application Ser. No. 14/915,185 filed Feb. 26, 2016 which is a U.S. National Phase application under 35 U.S.C. § 371 of International Application No. PCT/US2013/062453, filed Sep. 27, 2013 which are hereby incorporated by reference.

BACKGROUND

Field

Circuit devices and the manufacture and structure of fin based circuit devices.

Description of Related Art

Increased performance in and yield of circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor devices, such as those used in a complementary metal oxide semiconductor (CMOS), it is often desired to increase movement of electrons in N-type MOS device (n-MOS) channels and to increase movement of positive charged holes in P-type MOS device (p-MOS) channels. However, performance and movement are slowed by lattice mismatches and defects generated in a between layers of materials used to form the MOS.

For some CMOS implementation, the co-integration of lattice mismatched materials like III-V and IV material epitaxial growth on Silicon is a big challenge. Currently there is no state of art solution to co-integrate n- and p-MOS material epitaxial growths on to a single Silicon substrate. In addition, in current applications, due to large lattice mismatch in materials, crystalline defects are generated when novel materials (e.g., type III-V and IV (e.g., Germanium)) are grown on a Silicon material substrate.

DETAILED DESCRIPTION

Figure 1:
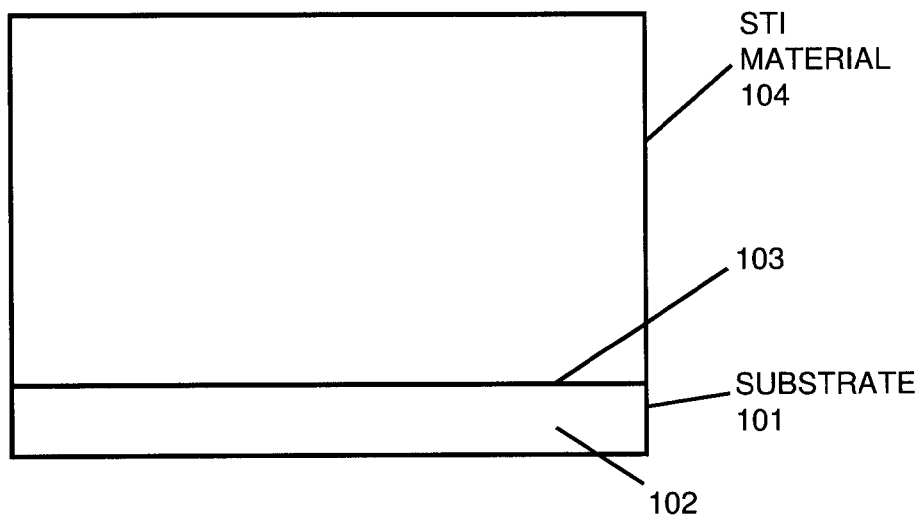
FIG. 1 is a schematic cross section view of a portion of a semiconductor substrate base after forming a layer of shallow trench isolation (STI) material on a top surface of the substrate.

Large lattice mismatch in materials may generate defects when certain materials (e.g., type III-V and IV (e.g., Germanium (Ge)) atomic element materials) are epitaxially grown on a Silicon material substrate (e.g., single crystal silicon). In some cases, the materials may be epitaxially grown from a substrate surface, in trenches between shallow trench isolation (STI) regions. The growth may be patterned and etched to form "fins" of material in or on which devices may be formed. Thus, the defects may exist in "fins" of material in or on which devices may be formed, after the fins are patterned and etched from the growths. If these defects propagate throughout the trench, they can lead to yield and variations issues in a device built on a device layer formed from epitaxial growth extending above the trench. This propagation may exist in "fin" devices formed in fins that are patterned and etched from epitaxial growth extending above the trench. Such fin devices may include fin integrated circuit (IC) transistors, resistors, capacitors, etc. formed in or on sidewalls of "fins" grown from or extending above a semiconductor (e.g., silicon) substrate or other material. Such devices may include fin metal oxide semiconductor (MOS) transistor devices, such as those used in a complementary metal oxide semiconductor (CMOS) based on movement of electrons in N-type (e.g., doped to have electron charge carriers) MOS device (n-MOS) channels and movement of positive charged holes in P-type (e.g., doped to have hole charge carriers) MOS device (p-MOS) channels.

Embodiments describe herein provide a solution to processes that trap defects only in one direction of the fin (along width W, such as shown in FIG. 2-6). The solution may include a process that uses the concept of aspect ratio trapping where Height (H) of the fin is larger than the width (W). However this scheme leaves large number of defects propagating towards the device layers in the long direction of the fin. According to embodiments, such defects can be avoided by traping defects along the sidewall of the STI forming the trenches (e.g., in both the W an length L directions) by making the Height (H) of the trench larger than the width (W) and length (L) of the trench such that ratios H/W>=1.5 and H/L>=1.5. This ratio (e.g., aspect ratio trapping or "ART") may give a minimum H/W ratio limit to block many defects within a buffer layer formed within the trench. Thus, the processes described herein may avoid crystaline defects in the fins due to lattice mismatch in the layer interfaces. For example, defects (e.g., crystaline defects) in the trench may not have extended into or not exist in the epitaxy regions (e.g., the upper device material of the regions). Thus, the fins formed from that material may provide electronic device material (e.g., wells and/or channels) in which defect free fin based devices may be formed.

According to some embodiments, Fin FET well and channel materials or layers may be grown using: (1) blanket buffer layer growth, (2) growth in a trench, and (3) growth of a cladding layer around a Si fin. While each of these is considered, it is noted that approach (1) may not allow p- and n-co-integration and may require thick buffer layers to be grown to reduce defects in device layers. Also, approach (2) may allow CMOS integration, however may require very deep narrow trench to accommodate all the buffer and device layers to be grown within the trench (e.g., see ART noted above). Next, approach (3) may not allow thick nor multilayer cladding layer to be grown around Si fin if there is a large lattice mismatch between Si fin and cladding layer.

Consequently, some embodiments described herein include growth of buffer layers in a trench followed by growth of device layers as "cladding". The approach helps to alleviate issues present in other fin FETs and fin FET formation processes (e.g., such as those noted above). Some proposed embodiments integrate non-Si device heterolayers on patterned Si for CMOS by a combination of selective and conformal (e.g., "cladding") epitaxy. Multi-buffer layers are grown in a trench such that the top layer in the trench has a lattice constant equivalent to the channel layer. This top ART layer could either be the channel layer or the high bandgap buffer just below the channel layer. Next STI may be recessed down to form a fin in the top layer. One or multicladding layers can then be grown around the fin to either generate a gate layer on which high-k dielectric/metal gate is later deposited or to form a combined channel and gate layer cladding. In another embodiment, highly doped epitaxial material can be grown on top of the gate cladding layer to reduce the resistance of the source/drain region.

In addition, embodiments describe herein provide a more efficient and reliable process for forming both p- and n-type epitaxial electronic device fins from the same substrate by integrating very large scale integration (VLSI) compatible fin structures with selective epitaxial growth and fabricating devices thereon. Such integration may include epitaxially growing a fin layer of a fin epitaxial material from a substrate surface at a bottom of a trench formed between a plurality of shallow trench isolation (STI) regions having STI sidewalls defining a first width and a first height of the trench. The trench height may be at least 1.5 times its width. Then, a top surface of the fin layer may be patterned and the STI regions may be etched to form an electronic device fin from a height of the fin layer extending above etched top surfaces of the plurality of STI regions (e.g., an "exposed" device well or gate layer). Then, a first conformal thickness of a first conformal epitaxial "cladding" material grown from sidewall surfaces and a top surface of the electronic device fin. Additional conformal thicknesses of a conformal epitaxial "cladding" materials can be grown from sidewall surfaces and a top surface of the first cladding material and/or of the electronic device fin.

In some cases, the epitaxial growth in the trench or of exposed fin may be or include buffer layers in a trench and be followed by growth of device layers, such as growth of cladding layers around surfaces of the fin to froma a "tri-gate" device. Transistor devices can then be formed on the sidewalls and top surface of the fin.

In some cases, two fins are formed in adjacent trenches and clad with such cladding material. In some cases, prior to growing the fin layer, a blanket buffer epitaxial material may be grown from the substrate surface; and fin layers grown in STI trenches formed above the blanket layer. Such formation of fins reduces defects from material interface lattice mismatches.

Embodiments described herein allow p- and n-co-integration for CMOS. In addition, the elimination (or reduction) of lattice mismatch between the fin and the cladding layer allows growth of multi-cladding layers without creation of defects. Thirdly, the embodiments reduce the stringent requirements to make deep trench to capture all dislocations within buffer layers before the device layers are grown in the trench.

Thus, the embodiments describe herein provide for (1) co-integration of n- and p-mos (e.g., forming of epitaxial trench material or regions for both n- and p-mos) on to the same silicon surface for CMOS implementation (e.g., and within certain length L, width W, and height H requirements as noted herein); (2) large reduction of defects propagating to the device layers on both n- and p-side electronic device fins; (3) capture defects both along (e.g., length L) and perpendicular (e.g., width W) to the electronic device fin (vertical or height) direction, thus minimizing density of defects reaching active device layers or device fins (e.g., provides bi-directional aspect ratio (e.g., selective "cadding") trapping of crystaline defects, such as by allowing single or multiple device or gate layers to be grown from the sidewall and top surfaces of the fin material. In some cases, the hetero-integrated solution proposed can be utilized to make any device architecture such as trigate, nanowires, nanoribbons, and the like.

FIG. 1 is a schematic cross section view of a portion of a semiconductor substrate base after forming a layer of STI material on a top surface of the substrate. FIG. 1 shows semiconductor substrate or base 101 of material 102 having top surface 103. Substrate 101 may include, be formed from, deposited with, or grown from silicon, polycrystalline silicon, single crystal silicon, or various other suitable technologies for forming a silicon base or substrate, such as a silicon wafer. For example, according to embodiments, substrate 101 may be formed by growing a single crystal silicon substrate base material having a thickness of between 100 Angstroms and 1000 Angstroms of pure silicon. Alternately, substrate 101 may be formed by sufficient chemical vapor deposition (CVD) of various appropriate silicon or silicon alloy materials 102 to form a layer of material having a thickness between one and three micrometers in thickness, such as by CVD to form a thickness of two micrometers in thickness. It is also considered that substrate 101 may be a relaxed, non-relaxed, graded, and/or non-graded silicon alloy material 102. Material 102 may be a relaxed material (e.g., have a non-strained lattice) at surface 103. Material 102 may be a single crystal silicon material. Substrate 102 may be made of silicon and have top surface 103 with a (100) crystal oriented material (e.g., according to Miller Index). Substrate 101 may be a "miscut" substrate.

FIG. 1 also shows a layer of shallow trench isolation (STI) material 104 formed or grown on top surface 103 of the substrate 101. STI material 104 may be formed of an oxide or a nitride or combination thereof. STI material 104 may be formed of SiC or another material as know in the art. STI material 104 may be formed by atomic layer deposition (ALD) or chemical vapor deposition (CVD). STI material 104 is generally deposited via Plasma Enhanced Chemical Deposition (PECVD). In some cases, any of various oxygen precursors, Silane precursors, or generic precursors can be used during a process (e.g., PECVD) to form STI material 104, as know in the art. In some cases, STI material 104 may be formed by a process using TEOS+O2+RF at 400° C.

In some cases, the bottom surface of material 104 may have the same (100) crystal orientation as that of material 102 (e.g., at surface 103). In some cases, the bottom surface of material 104 may have the same crystal lattice size as that of material 102 (e.g., at surface 103). Material 104 may be a relaxed material (e.g., have a non-strained lattice) with respect to its interface (e.g., where it is chemically or atomically bonded to the surface below) with surface 103.

Figure 2:
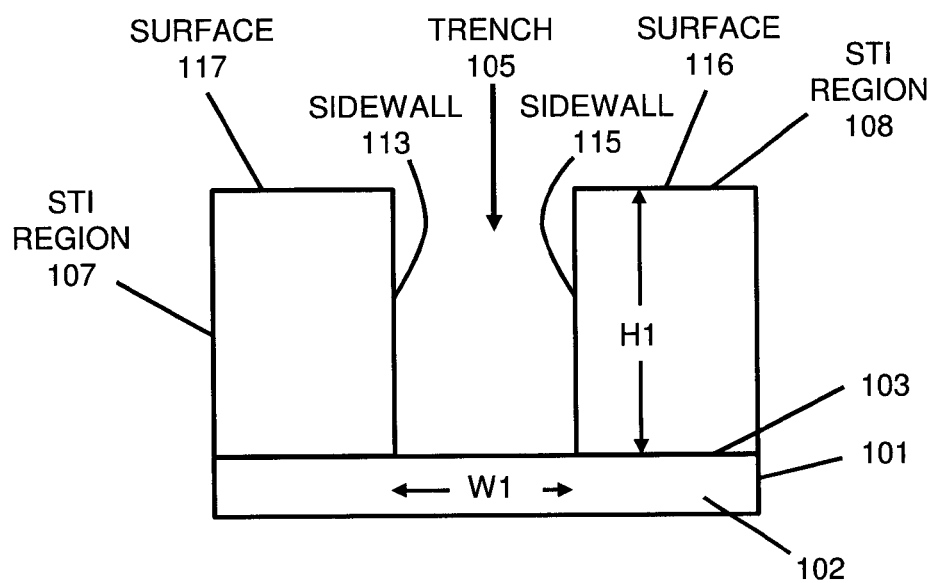
FIG. 2 shows the semiconductor substrate of FIG. 1 after forming STI regions and a trench between the STI regions.

FIG. 2 shows the semiconductor substrate of FIG. 1 after forming STI regions and a trench between the STI regions. FIG. 2 shows trench 105 defined between STI regions 107 and 108 and surface 103. Regions 107 and 108 may be formed by patterning and etching as known in the art. This may include forming a blanket layer of STI material 104, then patterning and etching material 104 to form STI regions 107 and 108. In some cases, patterning and etching material 104 to form the STI regions includes using a resist or hard mask underneath a resist for the patterning materials. In some cases 1, 2, or 3 resist layers may be used for the patterning materials. In some cases, patterning and etching material 104 to form the STI regions includes using an O2 or O2/Ar plasma etch at pressures in the 10-100 mTorr range, and at room temperature. Such patterning and etching may also include etching an oxides including STI material, by etching with fluorocarbons (e.g., CF4 and/or C4F8), O2 and Ar, at pressures in the 10-100 mTorr range, and at room temperature.

STI region 107 has sidewall 113 and top surface 117. STI region 108 has sidewall 115 and top surface 116. Sidewalls 113 and 115 may be vertical planar surfaces perpenticular to (e.g., at a right angle with respect to) horizontal planar surfaces surface 103 and horizontal planar surfaces surfaces 117 and 116. The sidewalls may comprise or be STI material 104. The STI regions 107 and 108 may have a width of at between 100 and 1000 nano-meters (nm).

Trench 105 may be defined by the sidewalls of regions 107 and 108. More specifically FIG. 2 shows trench 105 defined by or having a side at sidewall 113 of region 107, a side at sidewall 115 of region 108, a bottom at top surface 103, and a top adjacent (e.g., proximate) to top surfaces 117 or 116. Trench 105 may include surface 103 of material 102 exposed at the bottom of the trench, such as a planar or planarized surface of crystal material. In some cases, each of trench 105 is defined by additional sidewalls of other STI regions, such as a front and back STI having sidewall similar to sidewalls 113 and 115, and top surfaces similar to surfaces 117 or 116, but defining length L of trench 105.

Trench 105 may have width W1 defined by the horizontal distance between sidewall 113 of region 107 and side at sidewall 115 of region 108. Width W1 may be a width of between 10 and 100 nanometers (nm). In some cases W1 is approximately 25 nm.

Trench 105 may have height H1 defined by the vertical distance between top surface 103 and top surface 117 or 116. Height H1 may be a height of between 30 and 300 nanometers (nm). In some cases H1 is approximately 75 nm. H1 of the trench may be larger than the W1 of the trench such that ratio H1/W1 is >=1.5. In some cases, the ratio H1/W1 is =1.5. In some cases, the ratio H1/W1 is >=2.0.

Trench 105 may have a length L1 defined as the length going into the page and along sidewall 113 or sidewall 115. Length L1 may be a length of between 10 and 100 nanometers (nm). In some cases L1 is approximately 25 nm. In some cases L1 is equal to (or approximately the same as) W1. H1 of the trench may be larger than the L1 of the trench such that ratio H1/L1 is >=1.5. In some cases, the ratio H1/L1 is =1.5. In some cases, the ratio H1/L1 is >=2.0. According to some embodiments, W1 may be between 10 and 15 nanometers (nm) and H1 may be 350 nanometers (nm). Optionally L1 may be equal to W1.

FIG. 2 shows trench 105 defined between STI regions 107 and 108 and surface 103. However it is contemplated that more, similar trenches and regions may exist on substrate 101 (e.g., such as at least hundreds or hundreds of thousands).

Figure 3:
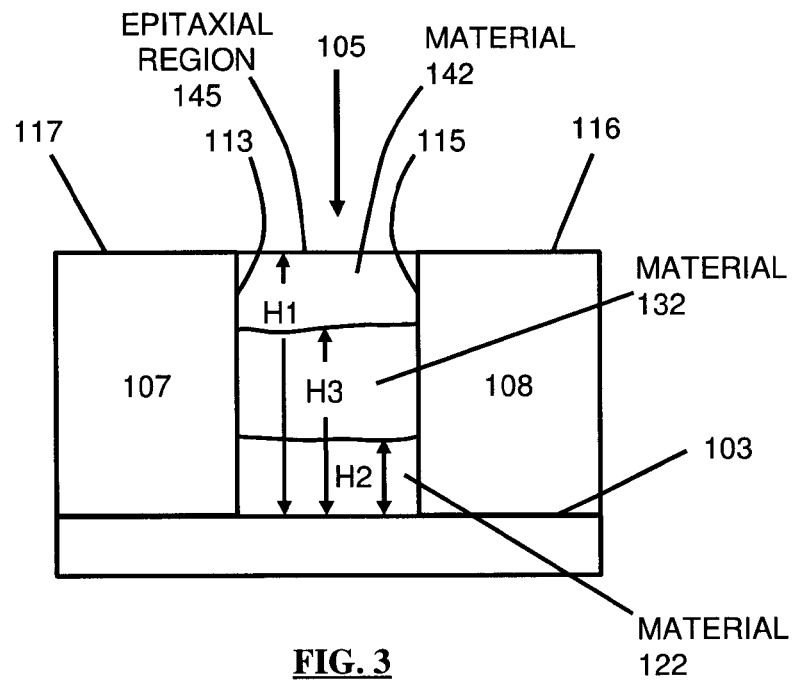
FIG. 3 shows the semiconductor substrate of FIG. 1 after forming epitaxial material in the trench between the STI regions.

FIG. 3 shows the semiconductor substrate of FIG. 1 after forming epitaxial material in the trench between the STI regions. FIG. 3 shows first layer of material 122 epitaxially grown from surface 103 in trench 105. Material 122 may be epitaxially grown from the crystal surface 103 of substrate surface 103. Material 122 may be formed by epitaxial growth (e.g., heteroepitaxy growth) using atomic layer epitaxy (ALE), chemical vapor deposition (CVD), Metal-Organic Chemical Vapour Deposition (MOCVD) or Metal-Organic vapour phase epitaxy (MOVPE), and may only grow from "seed" top surface 103 in the trench, but not grow from the STI sidewalls or STI top surfaces. In some cases, material 122 may be formed by epitaxial growth (e.g., heteroepitaxy) using molecular beam epitaxy (MBE), or migration enhanced epitaxy (MEE). Choice of growth deposition like growth temperature, pressure of gas flux, etc may define the selectivity of the epitaxial growth. In some cases, the growth of material 122 is grown selectively from surface 103 by choosing or using a predetermined growth temperature range, pressure of gas flux range, etc., as known for material 122 to grow from material of surface 103, but not grow from or initiate on material of the STI sidewall or top surfaces.

Material 122 may be a first layer of crystalline material that has height H2 from surface 103 which is less than H1. Material 122 may have a bottom surface having a (100) crystal oriented material grown from surface 103, and side surfaces having a (110) crystal oriented material along or adjacent to sidewalls 113 and 115. In some embodiments, crystaline defects may exist in material 122 near or along the sidewalls 113 and 115 of the STI forming the trenches. In some embodiments, crystaline defects may exist in material 122 due to defects, including the Stacking faults that originate at the STI sidewalls 113 or 115, that still remain within the trench 105.

Material 122 may have a top surface having a (100) crystal orientation (Miller Index). The top surface of material 122 may be polished or etched to form a flat surface having a (100) crystal index. Material 122 may have width W2 between sidewalls 113 and 115. W2 may be less than or equal to W1. In some cases, the difference in width may be due to crystaline defects in material 122. Material 122 may have a length L1.

Material 122 may have height H2 defined by the vertical distance between top surface 103 and a top surface of material 122. Height H2 may be a height of between 50-150 nanometers (nm). In some cases H2 is approximately 70 nm.

The bottom surface of material 122 may have the same (100) crystal orientation as that of material 102 (e.g., at surface 103). In some cases, the bottom surface of material 122 may have the same crystal lattice size as that of material 102 (e.g., at surface 103). Material 122 may be a relaxed material (e.g., have a non-strained lattice) with respect to its interface with surface 103. In some cases, material 122 is a relaxed layer (partially or fully) with respect to the substrate (e.g., surface 103).

FIG. 3 shows a second layer of material 132 epitaxially grown from a top surface of material 122. Material 132 may be epitaxially grown from the crystal top surface of material 122 by epitaxial growth (e.g., heteroepitaxy growth) and may only grow from "seed" top surface of material 122 below the trench top, but not grow from the sidewalls or STI top surfaces, similar to the description for growing material 122 from surface 103.

Material 132 may be a second layer of crystalline material that has height H3 defined by the vertical distance between top surface 103 and top surface of material 132. Height H3 may be less than H1. Material 132 may have a bottom surface having a (100) crystal oriented material grown from material 122, and side surfaces having a (110) crystal oriented material along or adjacent to sidewalls 113 and 115. In some embodiments, crystaline defects may exist in material 132 near or along the sidewalls of the STI forming the trenches. Material 132 may have a top surface having a (100) crystal orientation (Miller Index). The top surface of material 132 may be polished or etched to form a flat surface having a (100) crystal index.

Material 132 may have width W1 between sidewalls 113 and 115 in trench 105. Material 132 may have a length L1.

Height H3 may be a height of between 10-400 nanometers (nm). In some cases H3 is approximately 200 or 300 nm. According to some embodiments, the difference in height between the top of material 122 and the top of material 132 may be 200 nanometers (nm).

The bottom surface of material 132 may have the same (100) crystal orientation as that of material 122 (e.g., at its top surface). In some cases, the bottom surface of material 132 may have the same crystal lattice size as that of material 122 (e.g., at its top surface). Material 132 may be a relaxed material (e.g., have a non-strained lattice) with respect to its interface with material 122 (e.g., at its top surface). In some cases, material 132 is a relaxed layer (mostly or fully) with respect to material 122 (e.g., a top surface of material 122).

FIG. 3 shows a third layer of material 142 epitaxially grown from a top surface of material 132. Material 142 may be grown to height H1 above surface 103. In some cases material 142 have height H1-H3.

In some cases, material 142 may be a "device" layer, such as a layer on or in which circuitry devices are formed, as known in the art. Thus, the fins formed from material 142 may provide electronic device material (e.g., wells and/or channels) in which defect free fin based devices may be formed. Such devices may include devices described herein. In some cases, material 142 may be a "buffer" layer, such as a layer on or over which a "device" layer will be formed, as known in the art. Material 142 may be used to form an electronic device fin from an exposed height of material 142 (e.g., an "exposed" device well or gate layer) of the fin layer extending above an etched top surfaces of STI regions 107 and 108 (e.g., see FIG. 4).

In some embodiments, material 122 or 132 are optional and not formed in the trench, such as where material 142 is formed on layer 132 without layer 122, or material 142 is formed on layer 122 without layer 132. In some embodiments, only material 122, 132 or 142 is formed. In some embodiments, materials 122, 132 and/or 142 in the trench, as described above, are referred to as a single region, layer or material.

Material 142 may be epitaxially grown from the crystal top surface of material 132. Material 142 may be epitaxially grown from the crystal top surface of material 132 by epitaxial growth (e.g., heteroepitaxy growth) and may only grow from "seed" top surface of material 132 below the trench top, but not grow from the sidewalls or STI top surfaces, similar to the description for growing material 122 from surface 103.

Material 142 may be a third layer of crystalline material that has or extends to height H1 defined by the vertical distance between top surface 103 and a top surface of material 142. According to embodiments, growing or forming material 142 may include epitaxially growing a "fin layer" of a fin epitaxial material (e.g., material 142) from substrate surface 103 at a bottom of a trench 105 formed between shallow trench isolation (STI) regions 107 and 108 having STI sidewalls 113 and 115 defining a first width W1 and a first height H1 of the trench.

Material 142 may have a bottom surface having a (100) crystal oriented material grown from material 132, and side surfaces having a (110) crystal oriented material along a direction parallel to sidewalls 113 and 115. In some embodiments, crystaline defects may that existed in material 122 or 132 near or along the sidewalls of the STI do not extend into or to the top of material 142 (e.g., do not extend into height H1 above height H3).

Material 142 may have a top surface having a (100) crystal orientation (Miller Index). Material 142 may have horizontal width extending across or over the trenches and top surfaces surfaces 116 and 117 of STI regions 107 and 108. Material 142 may have a length L1.

In some cases, when material 142 is a multi-stack, height H1 may be a height of between 50 and 300 nanometers (nm). In some cases, when material 142 is a single layer, height H1 may be a height of between 20 and 300 nanometers (nm). In some cases, H1 is approximately 50 nm. According to some embodiments, the difference in height between the top of material 132 and the top of material 142 may be 50, 100, or 200 nanometers (nm).

The bottom surface of material 142 may have the same (100) crystal orientation as that of material 132 (e.g., at its top surface). In some cases, the bottom surface of material 142 may have the same crystal lattice size as that of material 132 (e.g., at its top surface). Material 142 may be a relaxed material (e.g., have a non-strained lattice) with respect to its interface with material 132 (e.g., at its top surface). In some cases, material 142 has a same lattice constant as the bottom of the material 122 or that of surface 103. In some cases, material 142 is lattice matched with respect to material 132 (e.g., a top surface of material 132). In some cases, material 142 is fully strained with respect to material 132 (e.g., a top surface of material 132). The strain may be tensile or compressive strain appropriate to increase carrier mobility.

In some embodiments, FIG. 3 may also show material 142 polished or planarized to height H1 above surface 103. The top surface of material 142 may be polished to form a flat surface having a (100) crystal index above or at a height H1 of top surface 155 of material 142. Top surface 155 may have the same height as and be planar with top surfaces 116 and 117. In some cases, after or as a result of polishing, materials 122, 132 and 142 in trench 105 may be described as epitaxial region 145. Polishing or planarizing epitaxial material 142 may be performed by chemical, physical or mechanical polishing as known in the art to form a top planar surfaces 155 of material 142.

Epitaxial region 145 may have W1 and L1, and H1. In some cases, materials 122, 132 and 142 may be described as an "epitaxial region"; or a "stack" of epitaxial layers or materials (e.g., after polishing to height H1). In some embodiments, materials 122, 132 and 142 in the trench may be described as a single "epitaxial region" (e.g., as single region 145); or a single "stack" of epitaxial layers or materials (e.g., after polishing to height H1). In some embodiments, material 122 or 132 are optional and not formed in the trench, such as where material 142 is formed on layer 132 without layer 122, or material 142 is formed on layer 122 without layer 132. In some embodiments, only material 122, 132 or 142 is formed. In some embodiments, materials 122, 132 and/or 142 in the trench, as described above, are referred to as a single region, layer or material.

According to some embodiments, W1 may be between 10 and 15 nanometers (nm); H1 may be 350 nanometers (nm); H2 may be 70 nanometers (nm); the difference in height between the top of material 122 and the top of material 132 may be 200 nanometers (nm); and the difference in height between the top of material 132 (e.g., height H3) and the top of material 142 (e.g., height H1) or epitaxial region 145 may be 50 nanometers (nm). Also, L1 may be equal to W1.

Figure 4:
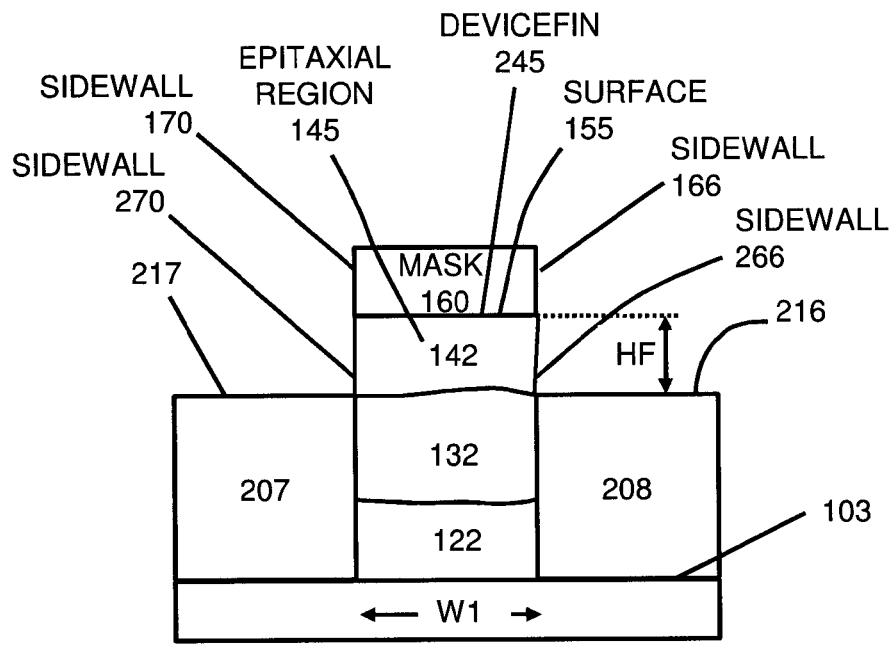
FIG. 4 shows the semiconductor substrate of FIG. 1 after patterning epitaxial material formed in the trench, and after etching the STI regions to form an electronic device fin from a height of the fin layer extending above etched top surfaces of the STI regions.

FIG. 4 shows the semiconductor substrate of FIG. 1 after patterning epitaxial material formed in the trench, and after etching the STI regions to form an electronic device fin from a height of the fin layer (e.g., material 142) extending above etched top surfaces of the STI regions. FIG. 4 shows pattern or mask 160 formed on top surface 155 of epitaxial region 145. In some cases, mask 160 has width W1 and a height above surface 155. Mask 160 may have a length L1. In some cases, mask 160 is formed by or of photoresist alone, or a photoresist/oxide combination; or a photoresist/nitride combination.

Mask 160 may have sidewalls 166 and 170 above or adjacent to sidewalls 113 and 115. In some cases, inner sidewalls 166 and 170 may be planar surfaces parallel to and aligned with (e.g., directly above) planar sidewalls 113 and 115. Mask 160 may also have inner sidewalls 166 and 170 above surfaces 116 and 117. Sidewalls 166 and 170 may be planar surfaces parallel to and above planar sidewalls 113 and 115, such as described for sidewalls 113 and 115.

According to embodiments, material 142 may be patterned (e.g., protected by mask 160), and STI regions 107 and 108 may be etched to form electronic device fin 245 from height HF of the fin layer extending above etched top surfaces 216 and 217 of the STI regions. In some cases, top surface 155 of fin or device material 142 is patterned with mask 160, and then top surfaces 116 and 117 of STI regions 108 and 107 are etched to remove thickness (e.g., height HF) of STI regions 108 and 107, to form electronic device fin 245 having height HF of the fin layer (e.g., material 142) extending above etched top surfaces 216 and 217 of the plurality of etched STI regions 208 and 207. Such etching may used a "timed" etch, such as an etch for a period of time known to remove height HF of the STI regions; or may use another process that is know to perform such etching. Fin 245 may be or include an "exposed" device well or gate layer extending or disposed height HF above the etched STI regions 208 and 207.

Fin 245 may be an epitaxially grown layer or fin a first epitaxial material (e.g., to become a P- or N-type material) having vertical sidewalls 266 and 270 extending height HF above surfaces 216 and 217. Fin 245 has sidewalls 266 and 270 that may be planar surfaces parallel to and aligned with (e.g., directly below) planar sidewalls 166 and 170. In some cases, sidewalls 266 and 270 may be planar surfaces parallel to and above planar sidewalls 113 and 115. Sidewalls and top surfaces of the fin may be considered "exposed" after etching an before growth of a material from these surfaces (e.g., such as growth a device channel or gate buffer layer).

In some cases, STI regions 107 and 108 are selectively etched with respect to masks 160 to form fin 245. Regions 107 and 108 may be etched by wet or dry etching to remove material 104 that is not protected by or below mask 160. Etching regions 107 and 108 may include descriptions above for etching material 104 to form STI regions 107 and 108. In some cases, regions 107 and 108 may be etched using a wet etch (e.g., of HF) or a dry etch to remove only or not more than height HF of the material of regions 107 and 108. In some cases, STI regions 108 and 107 are simultaneously etched, such as during processing that simultaneously effects, is applied to, or removes material of STI regions 108 and 107.

Fin 245 may have width W1, height HF above height H3, and length L1. In some cases the width W1, height HF and length L1 of fin 245 are equal to width W1, height H1-H3, and length L1 of region 145. In some cases, height HF may be less than H1-H3, such as due to (1) etching less than height HF of STI regions 108 and 107, and/or (2) polishing of material 142 to less than height H1 prior to forming mask 160. In some cases, the height HF and length L1 of fin 245 are equal to those of region 145, but the width and length are less than that of region 145 due to etching removing some of the fin width and length. In some cases, fin 245 may be defined by exposed the top surface 155 after removal of mask 160; and sidewalls 270 and 266 of epitaxial region 145.

In some cases, height HF may be a height of between 25 and 100 nanometers (nm). In some cases, height HF may be a height of between 30 and 70 nanometers (nm). In some cases, HF is approximately 50 nm.

Figure 5:
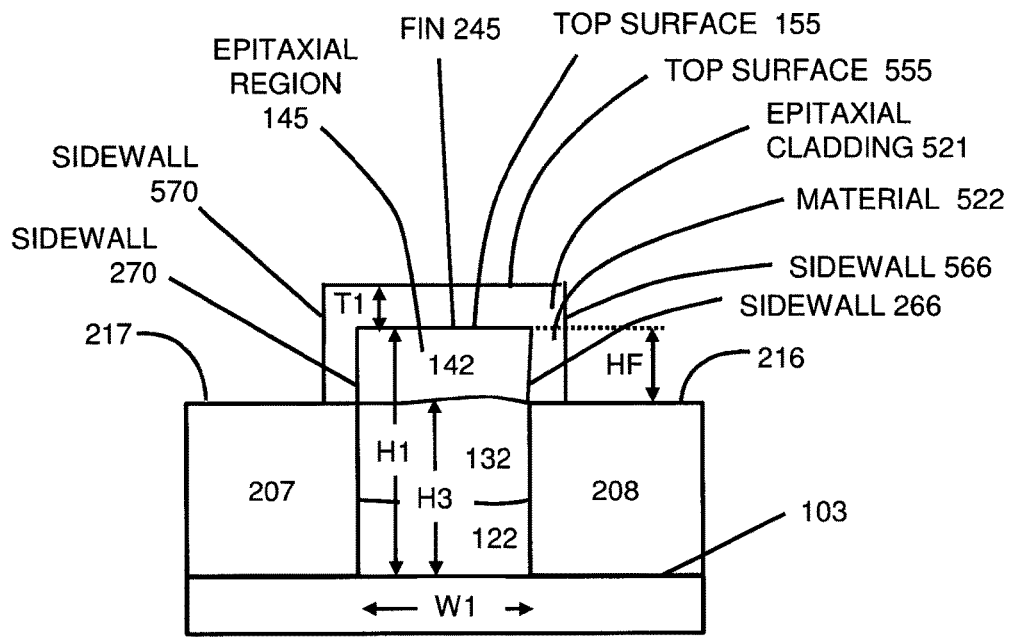
FIG. 5 shows the semiconductor substrate of FIG. 1 after forming a first conformal thickness of a first conformal epitaxial "cladding" material grown from sidewall surfaces and a top surface of the electronic device fin.

FIG. 5 shows the semiconductor substrate of FIG. 1 after forming a first conformal thickness of a first conformal epitaxial "cladding" material grown from sidewall surfaces and a top surface of the electronic device fin. FIG. 5 shows fin 245 of FIG. 4 after removing mask 160 to expose top surface 155, and growing conformal thickness T1 of conformal epitaxial "cladding" 521 of expitaxial material 522 from sidewall surfaces 266 and 270, and from top surface 155 of the electronic device fin 245.

Mask 160 may be etched by a dry etching process that removes the vertical thickness of Mask 160. In some cases, the etch may be an anisotropic etch. In some cases, the etch may be a subtractive etch, such as to etch away mask 160, with the exception of other materials, such as material 142, 207 and 208. In some cases, the etch may use Chlorine or another acidic dry chemistry. In some cases, mask 160 is selectively etched using a wet etch (e.g., of HF) or a dry etch to remove all of mask 160.

In some embodiments, material 522 is formed or grown as a "cladding" layer or material grown from sidewall surfaces 266 and 270 to form sidewall surfaces 566 and 570; and grown from top surface 155 to form top surface 555. Material 522 (e.g., Sidewall surfaces 566 and 570) may not grow from, but may touch surfaces 216 and 217.

In some cases, a "cladding" material (e.g., material 522) may be "selectively" grown only from a desired single crystal material (e.g., material 142 in this case) but not from other polycrystal, dielectric, oxide, nitride or amorphous exposed materials (e.g., that are not the desired or are not a single crystal material). In some cases, a "cladding" material (e.g., material 522) may be "selectively" grown only from a desired single crystal material (e.g., material 142 in this case) by masking or forming oxide layers over materials that it is not desired to have the "cladding" material form or grow from.

According to some embodiments, material 522 may be formed by epitaxial growth (e.g., heteroepitaxy growth) using atomic layer epitaxy (ALE), chemical vapor deposition (CVD), Metal-Organic Chemical Vapour Deposition (MOCVD) or Metal-Organic vapour phase epitaxy (MOVPE), and may only grow from "seed" sidewall and top surfaces of material 142. In some cases, material 522 may be formed by epitaxial growth (e.g., heteroepitaxy) using molecular beam epitaxy (MBE), or migration enhanced epitaxy (MEE) and may only grow from "seed" sidewall and top surfaces of material 142. Material 522 may be an epitaxially grown crystal material, grown from a single crystal surfaces of material 142.

Material 522 may be formed on or touching material 142. Material 522 may be formed to a conformal thickness (e.g., a thickness increasing the "height" on the top surface and "width" on the sidewalls) over fin 245. The conformal thickness T1 may be between 1 and 10 nanometers (nm). In some cases the conformal thickness T1 is approximately 2 nm. In some cases the conformal thickness T1 is approximately 5 nm. According to some embodiments, forming material 522 includes epitaxially cladding or growing material 522 along, across, touching or against the sidewall surfaces and the top surface of the electronic device fin 245.

Material 522 may have width equal to (W1+2(T1)), height equal to (HF+T1), and length L1. In some cases, material 522 may be defined by exposed the top surface 555; sidewalls 566 and 570 of the epitaxial regions. In some cases, sidewalls 566 and 570 may be planar surfaces parallel to and aligned with (e.g., directly adjacent to and wider than by thickness T1) planar sidewalls 266 and 270.

In some cases, material 522 may have a length of L1, such as where material 142 is a device buffer material, and material 522 is a channel material formed over all of a total length of the buffer material. In this case, the sidewall and top surfaces of material 142 may not be masked or patterned during cladding of material 522 onto material 142.

In some cases, material 522 may have a length of less than L1, such as where material 142 is a device channel material, and material 522 is a gate buffer material or a junction region material (of one or two junction regions) formed over a only portion (or two portions) of a total length of the channel material 142. If material 522 is a gate buffer material, a gate dielectric or electrode material may be clad from or formed over the gate buffer material.

In this case, the sidewall and top surfaces of material 142 along a length of material 142 (or two lengths) may be masked or patterned during cladding of material 522 onto material 142 so that material 522 is clad along only the desired portion (or two portions) of a total length of the channel material 142.

In some cases, material 522 is a gate buffer material that helps prevent defects between channel material 142 and a high K gate dielectric material formed over material 522 (e.g., for a tri-gate device) by having reduced broken bonds at the interface between material 142 and 522 (e.g., where material 522 is grown from material 142).

In some cases, material 522 is a gate buffer material and a high K gate dielectric or electrode material of between 2 and 3 nm in conformal thickness is formed over material 522 (e.g., for a tri-gate device), such as by cladding as described herein or by another process. In some cases, the high K gate dielectric or electrode material is or includes tantalum, SiO, HfO, and/or AlO.

In some cases, material 522 is a gate buffer material and a high K gate dielectric and a gate electrode material of between 10 and 30 nm in conformal thickness is formed over the gate dielectric material (e.g., for a tri-gate device), such as by cladding as described herein or by another process. In some cases, the gate electrode material is or includes titanium nitride, and/or tantalum nitride.

Figure 6A:
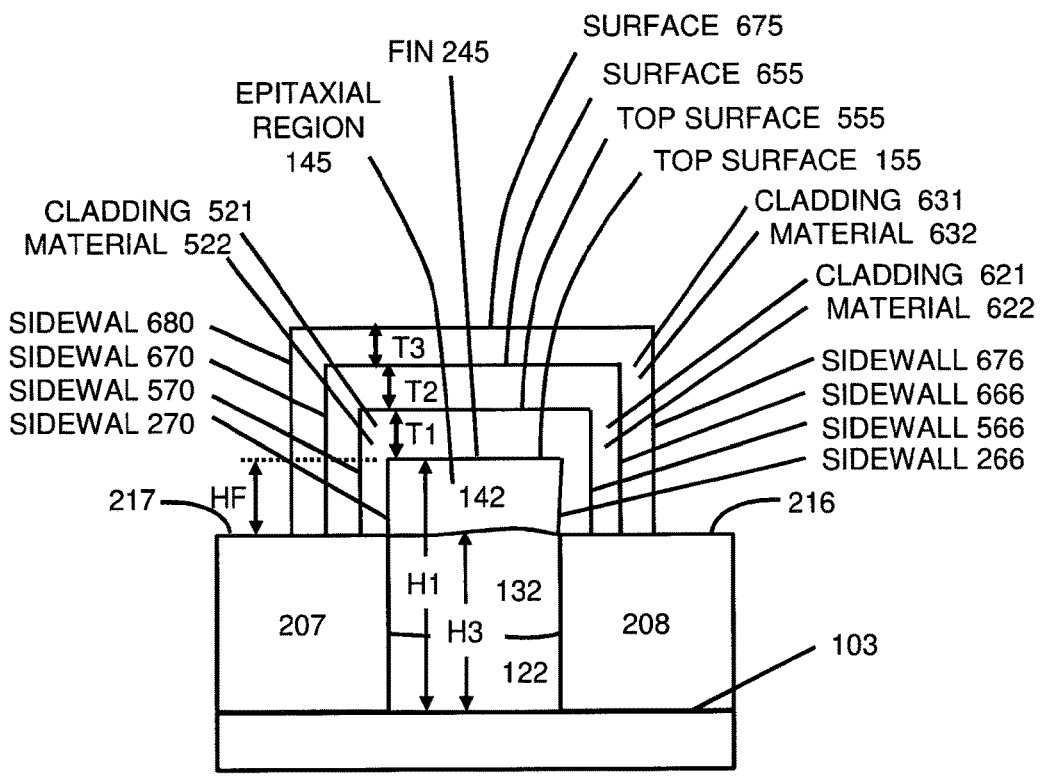
FIG. 6A shows the semiconductor substrate of FIG. 1 after forming a second and a third conformal thickness of a second and a third conformal epitaxial "cladding" material grown from sidewall surfaces and a top surface of the first conformal thickness.
Figure 6B:
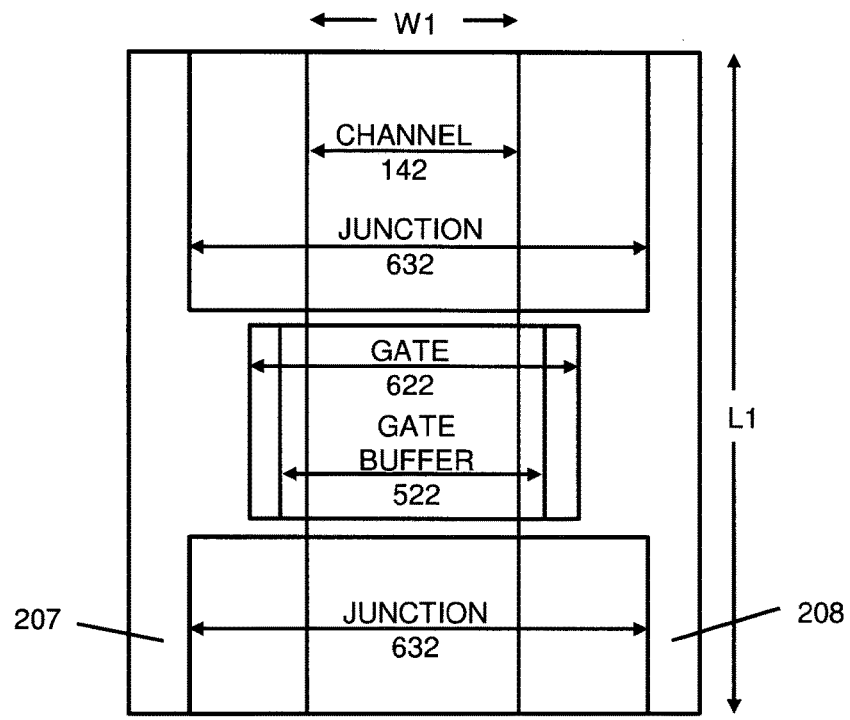
FIG. 6B is a schematic top perspective cross section view of examples of FIG. 6A, with a device gate buffer material formed over a portion of a total length of the channel material; a gate dielectric material or a gate electrode material formed over the device gate buffer material; and a junction region material (of two junction regions) formed over two portions of a total length of the channel material.
Figure 6C:
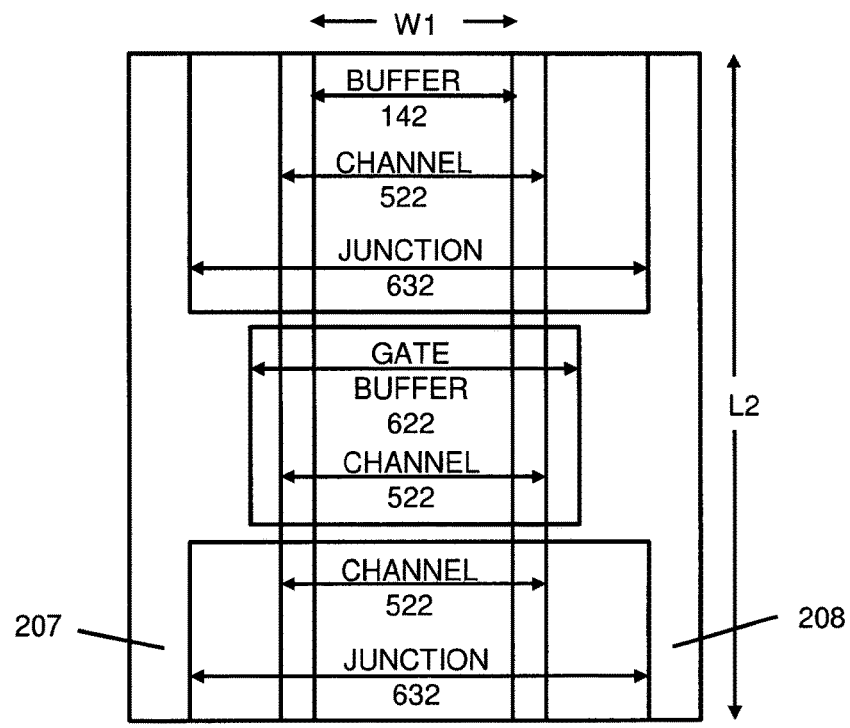
FIG. 6C is a schematic top perspective cross section view of examples of FIG. 6A, with a device channel material; a gate dielectric material or a gate electrode material formed over a portion of a total length of the device channel material; and a junction region material (of two junction regions) formed over two other portions of a total length of the channel material.

FIG. 6A shows the semiconductor substrate of FIG. 1 after forming a second and a third conformal thickness of a second and a third conformal epitaxial "cladding" material grown from sidewall surfaces and a top surface of the first conformal thickness. FIG. 6B is a schematic top perspective cross section view of examples of FIG. 6A, such as where material 522 is a device gate buffer material formed over a portion of a total length of the channel material 142; material 622 is a gate dielectric material or a gate electrode material formed over material 522; and material 632 is a junction region material (of two junction regions) formed over two portions of a total length of the channel material 142. FIG. 6C is a schematic top perspective cross section view of examples of FIG. 6A, such as where material 522 is a device channel material; material 622 is a gate dielectric material or a gate electrode material formed over a portion of a total length of material 522; and material 632 is a junction region material (of two junction regions) formed over two other portions of a total length of the channel material 522.

FIGS. 6A-C shows conformal thickness 521 of material 522 of FIG. 5 after growing conformal thickness T2 of conformal epitaxial "cladding" 621 of expitaxial material 622 from sidewall surfaces 566 and 570, and from top surface 555 over electronic device fin 245. In some embodiments, material 622 is formed or grown from sidewall surfaces 566 and 570 to form sidewall surfaces 666 and 670; and formed or grown from top surface 555 to form top surface 655. Material 622 (e.g., sidewall surfaces 666 and 670) may not grow from, but may touch surfaces 216 and 217. In some cases, material 622 is a "cladding" material that is "selectively" grown from material 522, similar to the description above of material 522 being a "cladding" material that is "selectively" grown from material 142.

According to some embodiments, material 622 may be formed by epitaxial growth (e.g., heteroepitaxy growth) using ALE, CVD, MOCVD, MOVPE, MBE, or MEE and may only grow from "seed" sidewall and top surfaces of material 522. Material 622 may be an epitaxially grown crystal material, grown from a single crystal surfaces of material 522.

Material 622 may be formed on or touching material 522. Material 622 may be formed to a conformal thickness T2 over material 522. The conformal thickness T2 may be between 1 and 10 nanometers (nm). In some cases the conformal thickness T2 is approximately 2 nm. In some cases the conformal thickness T2 is approximately 5 nm.

Material 622 may have width equal to (W1+2(T1)+2(T2)), height equal to (HF+T1+T2), and length L1. In some cases, material 622 may be defined by exposed the top surface 655; sidewalls 666 and 670 of the epitaxial regions. In some cases, sidewalls 666 and 670 may be planar surfaces parallel to and aligned with (e.g., directly adjacent to and wider than by thickness T2) planar sidewalls 566 and 570.

In some cases, material 622 may have a length of less than L1, such as where material 522 is a device gate buffer material, and material 622 is a gate dielectric material or a gate electrode material formed over a only portion of a total length of the channel material 142 (e.g., see FIG. 6B). If material 622 is a gate buffer material, a gate dielectric or electrode material may be clad from or formed over the gate buffer material.

In some cases, material 622 may have a length of less than L1, such as where material 522 is a device channel material, and material 622 is a gate dielectric material (e.g., see FIG. 6C), a gate electrode material or a junction region material (of one or two junction regions) formed over a only portion (or two portions) of a total length of the channel material 522.

In some case, the sidewall and top surfaces of material 522 along a length of material 522 (or two lengths) may be masked or patterned during cladding of material 622 onto material 522 so that material 522 is clad along only the desired portion (or two portions) of a total length of the channel material 522.

FIGS. 6A-C show growing conformal thickness T3 of conformal epitaxial "cladding" 631 of expitaxial material 632 from: (1) sidewall surfaces 266 and 270, and from top surface 555 of material 142 over electronic device fin 245 (e.g., see FIG. 6B); or (2) sidewall surfaces 566 and 570, and from top surface 555 of material 522 over electronic device fin 245 (e.g., see FIG. 6C). In some embodiments, material 632 is formed or grown from sidewall surfaces of material 142 or 522 to form sidewall surfaces 676 and 680; and formed or grown from top surfaces of material 142 or 522 to form top surface 675. Material 632 (e.g., sidewall surfaces 676 and 680) may not grow from, but may touch surfaces 216 and 217. In some cases, material 632 is a "cladding" material that is "selectively" grown from material 142 or 522, similar to the description above of material 522 being a "cladding" material that is "selectively" grown from material 142.

According to some embodiments, material 632 may be formed by epitaxial growth (e.g., heteroepitaxy growth) using ALE, CVD, MOCVD, MOVPE, MBE, or MEE and may only grow from "seed" sidewall and top surfaces of material 142 or 522. Material 632 may be an epitaxially grown crystal material, grown from a single crystal surfaces of material 142 or 522.

Material 632 may be formed on or touching material 142 or 522, but not touching or contacting material 622. Material 632 may be formed to a conformal thickness T3 over material 142 or 522. The conformal thickness T3 may be between 5 and 20 nanometers (nm). In some cases the conformal thickness T3 is approximately 10 nm. In some cases the conformal thickness T3 is approximately 15 nm.

Material 632 may have width equal to (W1+2(T1)+2(T2)+2(T3)), height equal to (HF+T1+T2+T3), and length L1. In some cases, material 632 may be defined by exposed the top surface 655; sidewalls 666 and 670 of the epitaxial regions. In some cases, sidewalls 676 and 680 may be planar surfaces parallel to and aligned with (e.g., directly adjacent to and wider than by thickness T3) planar sidewalls 566 and 570.

In some cases, such as shown in FIG. 6B, material 632 may have a length of less than L1, such as where material 522 is a gate buffer material formed over a only portion of a total length of the channel material 142, material 622 is a gate dielectric material, or a gate electrode material formed material 522, and material 632 is a junction region material (of two junction regions) formed over a only a portion (or two portions) of a total length of the channel material 142. In this case, the sidewall and top surfaces of material 142 along a two lengths of material 142 may be masked or patterned during cladding of material 632 onto material 142 so that material 142 is clad along only the desired portion (or two portions) of a total length of the channel material 142.

In some cases, such as shown in FIG. 6C, material 632 may have a length of less than L1, such as where material 522 is a device channel material, and material 632 is a gate dielectric material, a gate electrode material or a junction region material (of one or two junction regions) formed over a only portion (or two portions) of a total length of the channel material 522.

In this case, the sidewall and top surfaces of material 522 along a length of material 522 (or two lengths) may be masked or patterned during cladding of material 632 onto material 522 so that material 522 is clad along only the desired portion (or two portions) of a total length of the channel material 522.

According to some embodiments, material 622 may be a gate dielectric material or a gate electrode material formed over a only portion of a total length of the channel material 522; and material 632 represents two sections (e.g., source and drain) of junction region material formed over two other portions of the total length of the channel material 522 (e.g., see FIG. 6C).

In this case, the sidewall and top surfaces of material 522 may be patterned to clad material 622 onto material 522, and then material 622 may be subsequently patterned during cladding of material 632 onto material 522 (e.g., see FIG. 6C). It can be appreciated that for some embodiments, this order can be reversed.

According to a first set of exemplary embodiments, material 122 is a "buffer" material having a lattice constant between that of the material that material 122 is grown from (e.g., surface 103, such as of Si) and that of the material that is grown from material 122 (e.g., material 132 grown from or formed on layer 122). In some embodiments, layer 122 is a single layer, while in others, it is multiple layers. In some cases, layer 122 is a graded buffer layer having a concentration of Ge that increases from zero percent at surface 103 to 30 percent at its top surface. In some cases, layer 122 is a selectively grown epitaxial layer.

In some cases, material 122 is a layer of InP material (e.g., 50 percent In, and 50 percent P) such as for an N-type device formed from fin 245; or is a layer of SiGe material (e.g., 70 percent Si, and 30 percent Ge) such as for an P-type device formed from fin 245.

In some cases, layer 122 is a selectively grown epitaxial layer that is grown from portions of surface 103 only in trenches, but not from STI material or surfaces forming the trenches. In some cases, layer 122 represents separate selectively grown epitaxial layers that are grown from portions of surface 103 in two adjacent trenches, but not from STI material or surfaces forming the trenches, such as will be described below for FIGS. 6-12. In some cases, layer 122 is a blanket (e.g., non-selective) epitaxial layer grown from all of surface 103 below STI material and two different trenches, such as will be described below for FIGS. 13-19.

In some cases, material 132 is a relaxed "buffer" material having a lattice constant the same as or close to that of the material that is grown from material 132 (e.g., material 142 grown from or formed on layer 132). In some embodiments, layer 132 is a single layer, while in others, it is multiple layers. In some cases, layer 132 is a graded buffer layer having a concentration that increases from its bottom to its top surface. In some cases, layer 132 is an ART epitaxial buffer layer as known in the art. In some cases, layer 132 is a selectively grown epitaxial layer. In some cases, material 132 is a layer of InAlAs material (e.g., 52 percent In, 48 percent Al) such as for an N-type device formed from fin 245; or is a layer of SiGe material (e.g., 30 percent Si, and 70 percent Ge) such as for an P-type device formed from fin 245. In some cases the layer of InAlAs is 70 percent In and 30 percent Al; or $In_xAl_{1-x}As$ where x=0.7; or 70% of In and 30% of Al for group III side and 100% for As which is group V material.

According to some embodiments, material 132 and 142 are the same material. In such cases, material 132 and 142 may be the same material grown during the same growth process or time. In some of these cases, material 142 is a buffer material upon with the device material or layers are formed cladding materials (e.g., material 522 is a channel material). In some cases, layer 142 is free from crystaline defects that are prevented by the ART of growing layers 122, 132 and 142 in ART trench 105.

According to some embodiments, material 132 and 142 are different materials. In such cases, material 132 and 142 may be different materials grown during different growth processes or at different times. In these cases, material 142 may be a device material or layer (e.g., material 142 is a channel material). According to some embodiments, material 142 may be channel material or layer, such as for a tri-gate device having the channel conducting charges along the sidewall and top material of material 142; and material 522 may be a gate region or layer (e.g., gate dielectric and gate electrode), such as for a tri-gate device having the gate biasing the conducted charges along the sidewall and top material of material 142. In some cases, material 142 is a single layer of Ge, InGaAs or InAs material.

In some cases, material 142 is a channel layer of InGaAs material (e.g., 70 percent InAs and 30 percent GaAs; or 70% of In and 30% of Ga for group III side and 100% for As which is group V material; or $In_xGa_{1-x}As$ where x=0.53) and material 522 is an InP cladding gate buffer material for gate dielectric layer formed on a portion of the length of layer 522, such as such as for an N-type device formed from fin 245. In some cases, material 142 is a channel layer of Ge device material and material 522 is a Si cladding gate buffer material for gate dielectric layer formed on a portion of a length of layer 522, such as such as for an P-type device formed from fin 245. In some cases, layer 142 is free from crystaline defects that are prevented by the ART of growing layers 122, 132 and 142 in ART trench 105. In some cases, material 142 may be another buffer material upon which a device material or layer is clad (e.g., as channel material 522). In these cases, material 142 may extend below surfaces 216 and 217, such as where H3 is less than shown in the figures and HF extends below surfaces 216 and 217.

In some cases, material 122 is a layer of SiGe material (e.g., 70 percent Si, and 30 percent Ge) such as a "buffer" material; material 132 is a layer of SiGe material (e.g., 30 percent Si, and 70 percent Ge) such as a relaxed "buffer" material; and layer 142 is a channel layer over the total length of material 142 of either (1) a layer of InP material (e.g., 50 percent In, and 50 percent P), or (2) a layer of InAlAs material (e.g., 50 percent In, 25 percent Al and 25 percent As) such as such as for an N-type device formed from fin 245. In some cases the layer of InAlAs is 70 percent InAs and 30 percent AlAs; or $In_xAl_{1-x}As$ where x=0.7; or 70% of In and 30% of Al for group III side and 100% for As which is group V material.

According to some embodiments, material 622 is grown on material 522, and material 632 is grown on material 522. In such cases, material 142 may be a buffer material; material 522 may be channel material or layer, such as for a tri-gate device having the channel conducting charges along the sidewall and top material of material 522; material 622 may be a gate region or layer (e.g., gate dielectric and gate electrode), such as for a tri-gate device having the gate biasing the conducted charges along a portion of the length of the sidewall and top material of material 522; and material 632 may be or include two junction regions or layers on or touching material 522, such as for a tri-gate device having separate source and drain regions at or across different portions of length L1 along the sidewall and top material of material 522.

According to some embodiments, material 622 is grown on material 522, but material 632 is not grown on material 622. In such cases, material 142 may be a buffer material; material 522 may be channel material or layer, such as for a tri-gate device having the channel conducting charges along the sidewall and top material of material 522; and material 622 may be (1) a gate region or layer (e.g., gate dielectric and gate electrode), such as for a tri-gate device having the gate biasing the conducted charges along a portion of the length of the sidewall and top material of material 522, or (2) two junction regions or layers on or touching material 522, such as for a tri-gate device having separate source and drain regions at or across different portions of length L1 along the sidewall and top material of material 522.

In some cases, material 522 is a cladding layer of doped N-type InGaAs channel material (e.g., 70 percent InAs and 30 percent GaAs; or 70% of In and 30% of Ga for group III side and 100% for As which is group V material; or $In_xGa_{1-x}As$ where x=0.53); material 622 is gate dielectric or electrode of InP cladding material (e.g., 50 percent In, and 50 percent P) on or over an N-type channel formed of material 522 clad on fin 245; and material 632 represents two junction regions of InGaAs material (e.g., 70 percent InAs and 30 percent GaAs; or 70% of In and 30% of Ga for group III side and 100% for As which is group V material; or $In_xGa_{1-x}As$ where x=0.53) as cladding material grown from channel material 142.

In some cases, material 522 is a cladding layer of doped P-type Ge channel material; and material 622 is gate dielectric or electrode of Si cladding material on or over an P-type channel formed of material 522 clad on fin 245. In addition, in some cases, material 632 represents two junction regions of titanium and/or aluminum based junction material as cladding material grown from channel material 142.

According to a second set of exemplary embodiments, material 122 is a single layer of a "buffer" material having a lattice constant between that of surface 103 and material 132. In these cases, layer 122 is a selectively grown epitaxial layer that is grown from portions of surface 103 in trench 105, but not from STI material or surfaces forming the trenches.

In these cases, material 122 is a layer of InP material (e.g., 50 percent In, and 50 percent P) such as for an N-type channel formed of material 142 in fin 245. In these cases, material 132 is a relaxed "buffer" material having a lattice constant the same as or close to that of material 142. In these cases, material 132 is a layer of InAlAs material (e.g., 50 percent In, 25 percent Al and 25 percent As) such as for an N-type channel formed of material 142 in fin 245. In some cases the layer of InAlAs is 70 percent InAs and 30 percent AlAs; or $In_xAl_{1-x}As$ where x=0.7; or 70% of In and 30% of Al for group III side and 100% for As which is group V material.

In these cases, material 142 is a channel material or layer for a tri-gate device having the channel conducting charges along the sidewall and top material of material 142; and material 522 is a gate region or layer (e.g., gate dielectric and gate electrode), such as for a tri-gate device having the gate biasing the conducted charges along the sidewall and top material of material 142. In these cases, material 142 is a layer of doped N-type InGaAs channel material (70 percent InGa and 30 percent GaAs; or 70% of In and 30% of Ga for group III side and 100% for As which is group V material; or $In_xGa_{1-x}As$ where x=0.53). In these cases, material 522 is gate buffer layer of InP cladding material (e.g., 50 percent In, and 50 percent P) grown from a portion of the length of the N-type channel formed of material 142 in fin 245, and upon which a gate dielectric layer may be formed, such as such as for an N-type device formed from or on fin 245.

According to a third set of exemplary embodiments, material 122 is a single layer of a "buffer" material having a lattice constant between that of surface 103 and material 132. In these cases, layer 122 is a selectively grown epitaxial layer that is grown from portions of surface 103 in trench 105, but not from STI material or surfaces forming the trenches. In these cases, material 122 is a layer of SiGe material (e.g., 70 percent Si, and 30 percent Ge) such as for a P-type channel formed of material 142 in fin 245. In these cases, material 132 is a relaxed "buffer" material having a lattice constant the same as or close to that of material 142. In these cases, material 132 is a layer of SiGe material (e.g., 30 percent Si, and 70 percent Ge) such as for a P-type channel formed of material 142 in fin 245.

In these cases, material 142 is a channel material or layer for a tri-gate device having the channel conducting charges along the sidewall and top material of material 142; and material 522 is a gate region or layer (e.g., gate dielectric and gate electrode), such as for a tri-gate device having the gate biasing the conducted charges along the sidewall and top material of material 142. In these cases, material 142 is a layer of doped P-type Ge channel material. In these cases, material 522 is gate buffer layer of Si cladding material grown from a portion of the length of the P-type channel formed of material 142 in fin 245, and upon which a gate dielectric layer may be formed, such as such as for an P-type device formed from or on fin 245.

According to a fourth set of exemplary embodiments, material 122 is a single layer of a "buffer" material having a lattice constant between that of surface 103 and material 132. In these cases, layer 122 is a selectively grown epitaxial layer that is grown from portions of surface 103 in trench 105, but not from STI material or surfaces forming the trenches. In these cases, material 122 is a layer of InP material (e.g., 50 percent In, and 50 percent P) such as for an N-type channel formed of material 522 in fin 245.

In these cases, material 132 and 142 are the same material (e.g., material 132/142). In these cases, material 132/142 is a relaxed "buffer" material having a lattice constant the same as or close to that of material 522 clad on fin 245. In these cases, material 132/142 is a layer of InAlAs material (e.g., 50 percent In, 25 percent Al and 25 percent As) such as for an N-type channel formed of material 522 clad on fin 245. In some cases the layer of InAlAs is 70 percent InAs and 30 percent AlAs; or $In_xAl_{1-x}As$ where x=0.7; or 70% of In and 30% of Al for group III side and 100% for As which is group V material.

In such cases, material 522 is a channel material or layer, such as for a tri-gate device having the channel conducting charges along the sidewall and top material of material 522; material 622 is a gate region or layer (e.g., gate dielectric and gate electrode), such as for a tri-gate device having the gate biasing the conducted charges along the sidewall and top material of material 522; and material 632 includes junction regions or layers on or touching material 522, such as for a tri-gate device having separate source and drain region at or across different portions of length L1 along the sidewall and top material of material 522. In these cases, material 522 is a cladding layer of doped N-type InGaAs channel material (e.g., 70 percent InAs and 30 percent GaAs; or 70% of In and 30% of Ga for group III side and 100% for As which is group V material; or $In_xGa_{1-x}As$ where x=0.53).

In these cases, material 622 is gate dielectric or electrode of InP cladding material (e.g., 50 percent In, and 50 percent P) on or over an N-type channel formed of material 522 clad on fin 245. In these cases, material 632 represents two junction regions of InGaAs material (e.g., 70 percent InAs and 30 percent GaAs; or 70% of In and 30% of Ga for group III side and 100% for As which is group V material; or $In_xGa_{1-x}As$ where x=0.53) as cladding material grown from channel material 142.

According to a fifth set of exemplary embodiments, material 122 is a single layer of a "buffer" material having a lattice constant between that of surface 103 and material 132. In these cases, layer 122 is a selectively grown epitaxial layer that is grown from portions of surface 103 in trench 105, but not from STI material or surfaces forming the trenches. In these cases, material 122 is a layer of SiGe material (e.g., 70 percent Si, and 30 percent Ge) such as for a P-type channel formed of material 522 in fin 245.

In these cases, material 132 and 142 are the same material (e.g., material 132/142). In these cases, material 132/142 is a relaxed "buffer" material having a lattice constant the same as or close to that of material 522 clad on fin 245. In these cases, material 132/142 is a layer of SiGe material (e.g., 30 percent Si, and 70 percent Ge) such as for a P-type channel formed of material 522 clad on fin 245.

In such cases, material 622 is grown on material 522, but material 632 is not grown on material 622. In such cases, material 142 is a buffer material; material 522 is a channel material or layer, such as for a tri-gate device having the channel conducting charges along the sidewall and top material of material 522; and material 622 may be a gate region or layer (e.g., gate dielectric and gate electrode), such as for a tri-gate device having the gate biasing the conducted charges along the sidewall and top material of material 522.

In these cases, material 522 is a cladding layer of doped P-type Ge channel material. In these cases, material 622 is gate dielectric or electrode of Si cladding material on or over an P-type channel formed of material 522 clad on fin 245.

According to a sixth set of exemplary embodiments, material 122 is a single layer of a "buffer" material having a lattice constant between that of surface 103 and material 132. In these cases, layer 122 is a selectively grown epitaxial layer that is grown from portions of surface 103 in trench 105, but not from STI material or surfaces forming the trenches. In these cases, material 122 is a layer of SiGe material (e.g., 70 percent Si, and 30 percent Ge) such as for an N-type channel formed of material 522 clad on fin 245.

In these cases, material 132 is a relaxed "buffer" material having a lattice constant the same as or close to that of material 522. In these cases, material 132 is a layer of SiGe material (e.g., 30 percent Si, and 70 percent Ge) such as for an N-type channel formed of material 522 clad on fin 245.

In these cases, material 142 may be another buffer material upon which a device material or layer is clad (e.g., as channel material 522). In these cases, material 142 may extend below surfaces 216 and 217, such as where H3 is less than shown in the figures and HF extends below surfaces 216 and 217.

In these cases, layer 142 is either (1) a layer of InP material (e.g., 50 percent In, and 50 percent P), or (2) a layer of InAlAs material (e.g., 50 percent In, 25 percent Al and 25 percent As) such as for an N-type channel formed of material 522 clad on fin 245. In some cases the layer of InAlAs is 70 percent InAs and 30 percent AlAs; or $In_xAl_{1-x}As$ where x=0.7; or 70% of In and 30% of Al for group III side and 100% for As which is group V material.

In such cases, material 522 is a channel material or layer, such as for a tri-gate device having the channel conducting charges along the sidewall and top material of material 522; material 622 is a gate region or layer (e.g., gate dielectric and gate electrode), such as for a tri-gate device having the gate biasing the conducted charges along the sidewall and top material of material 522; and material 632 includes junction regions or layers on or touching material 522, such as for a tri-gate device having separate source and drain region at or across different portions of length L1 along the sidewall and top material of material 522.

In these cases, material 522 is a cladding layer of doped N-type InGaAs channel material (e.g., 70 percent InAs and 30 percent GaAs; or 70% of In and 30% of Ga for group III side and 100% for As which is group V material; or $In_xGa_{1-x}As$ where x=0.53). In these cases, material 622 is gate dielectric or electrode of InP cladding material (e.g., 50 percent In, and 50 percent P) on or over an N-type channel formed of material 522 clad on fin 245. In these cases, material 632 represents two junction regions of InGaAs material (e.g., 70 percent InAs and 30 percent GaAs; or 70% of In and 30% of Ga for group III side and 100% for As which is group V material; or $In_xGa_{1-x}As$ where x=0.53) as cladding material grown from channel material 142.

Figure 7:
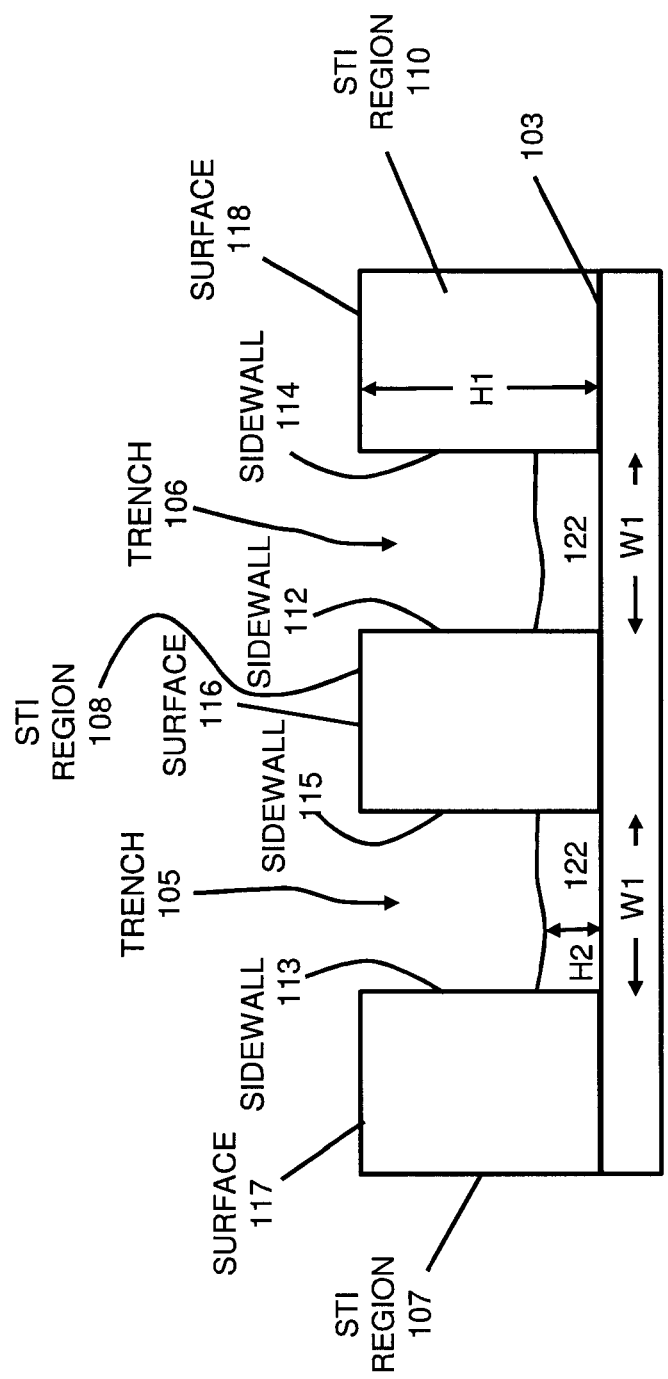
FIG. 7 shows the semiconductor substrate of FIG. 1 after forming STI regions and two trenches between the STI regions.

FIG. 7 shows the semiconductor substrate of FIG. 1 after forming STI regions and two trenches between the STI regions. FIG. 7 shows trenches 105 and 106 defined between STI regions 107, 108 and 110 and surface 103. Region 110 and trench 106 may be formed as described above for forming regions 107, 108 and trench 105. Trenches 105 and 106 may be adjacent trenches that are next to each other without other device fins formed in or within region 108 between trenches 105 and 106.

STI region 108 has sidewalls 112 and 115, and has top surface 116. STI region 110 has sidewall 114 and top surface 118. Sidewalls 112 and 114 may be vertical planar surfaces perpenticular to (e.g., at a right angle with respect to) horizontal planar surfaces surface 103 and horizontal planar surfaces surfaces 116 and 118. The sidewalls may comprise or be STI material 104. STI regions 108 and 110 may have a width W1 defined by the horizontal distance between their sidewalls. STI region 108 may have width W1 defined by the horizontal distance between sidewall 115 of region 107 and side at sidewall 112 of region 108. STI region 110 may have height H1 defined by the vertical distance between top surface 103 and top surface 118. STI region 110 may have a length L1 defined as the length going into the page and along sidewall 114.

Trench 106 may be defined by the sidewalls of regions 108 and 110. More specifically FIG. 7 shows trench 106 defined by or having a side at sidewall 112 of region 108, a side at sidewall 114 of region 110, a bottom at top surface 103, and a top (e.g., opening or corners) adjacent to top surfaces 116 or 118. Trench 106 may include surface 103 of material 102 exposed at the bottom of the trench, such as a planar or planarized surface of crystal material. In some cases, trench 106 is defined by additional sidewalls of other STI regions, such as a front and back STI having sidewall similar to sidewalls 112 and 114, and top surfaces similar to surfaces 117 or 118, but defining length L of trench 106.

Trench 106 may have width W1 defined by the horizontal distance between sidewall 112 of region 108 and side at sidewall 114 of region 110. In some cases W1 is three times the pitch of the fins formed in the epitaxial regions, such as three times the horizontal pitch between the midpoint of fins 1145 and 1146, or between that of fins 1845 and 1846 (e.g., see FIGS. 11 and 18). Trench 106 may have height H1 defined by the vertical distance between top surface 103 and top surface 117 or 118.

Trench 106 may have a length L1 defined as the length going into the page and along sidewall 112 or 114. In some cases L1 is two times the pitch of the gates of transistor devices formed on the fins, such as two times the pitch between the gates of transistor devices formed on fins 1145 and 1146, or fins 1845 and 1846 (e.g., see FIGS. 11 and 18).

FIG. 7 shows trenches 105 and 106 defined between STI regions 107, 108 and 110 and surface 103. However it is contemplated that more, similar trenches and STI regions may exist on substrate 101 (e.g., such as at least hundreds or hundreds of thousands). FIG. 7 shows the semiconductor substrate of FIG. 1 after forming epitaxial material 122 in the trenches between the STI regions. FIG. 3 shows a first layer of material 122 epitaxially grown from surface 103 in trenches 105 and 106. Material 122 may be epitaxially grown from the crystal surface of substrate surface 103 in trench 106 with respect to STI material surfaces 112, 114, 116 and 118, similar to the description above for growing material 122 in trench 105 with respect to STI material surfaces 113, 115, 117 and 116, respectively.

Figure 8:
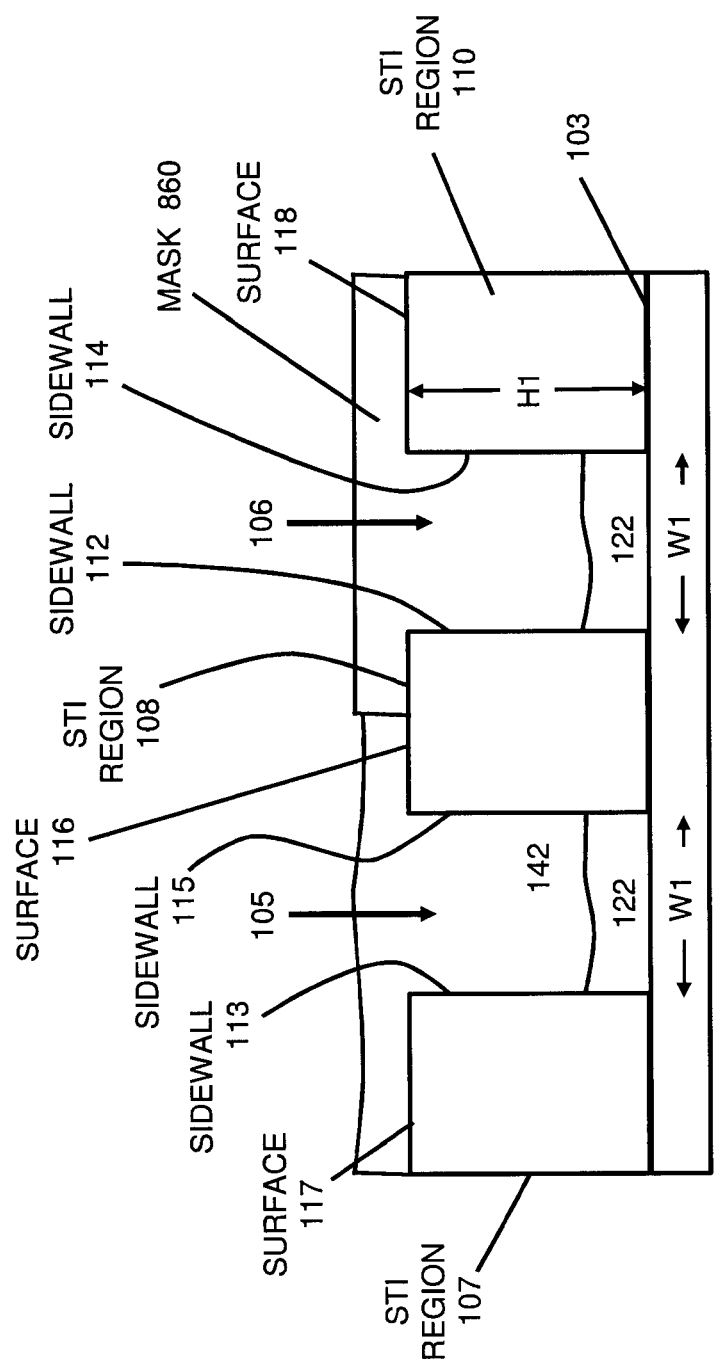
FIG. 8 shows the semiconductor substrate of FIG. 1 after forming a mask over material in a second trench, and forming second epitaxial material in the first trench.

FIG. 8 shows the semiconductor substrate of FIG. 1 after forming a mask over material 122 in trench 106, and forming second epitaxial material 142 in the trench 105. FIG. 8 shows pattern or mask 860 formed on top surfaces of material 122 in trench 106, sidewall surfaces of trench 106, and at least a portion of top surfaces 116 and 118. In some cases, mask 860 has width across top surfaces 116 and 118 that is greater than W1, and a height above surface 103 that is greater than H1. Mask 860 may have a length L1. In some cases, mask 860 is formed by or of photoresist alone, or a photoresist/oxide combination; or a photoresist/nitride combination. Mask 860 may have sidewalls above top surfaces 116 and 118, and may have a planarized top surface. Mask 860 may seal off trench 106 so that after forming mask 860, material grown or deposited in trench 105 does not enter trench 106.

FIG. 8 shows a second layer of material 142 epitaxially grown from a top surface of material 122. Material 142 may be epitaxially grown from the crystal top surface of material 122. Material 142 may be a "device" layer, such as a layer on or in which circuitry devices are formed, as known in the art. Such devices may include devices described herein.

Material 142 may be formed by epitaxial growth (e.g., heteroepitaxy) from material 122, similar to descriptions above for growing material 142 from material 132. Material 142 may be epitaxially grown from the crystal surface of material 132 in trench 105 with respect to STI material surfaces 113, 115, 116 and 117, similar to the description above for FIG. 3. Material 142 may be grown to height greater than H1 above surface 103.

The bottom surface of material 142 may have the same (100) crystal orientation as that of material 122 (e.g., at its top surface). In some cases, the bottom surface of material 142 may have the same crystal lattice size as that of material 122 (e.g., at its top surface). Material 142 may be a relaxed material (e.g., have a non-strained lattice) with respect to its interface with material 122 (e.g., at its top surface). In some cases, material 142 has a same lattice constant as the bottom of surface 103. In some cases, material 142 is lattice matched with respect to a top surface of material 122. In some cases, material 142 is fully strained with respect to a top surface of material 122. The strain may be tensile or compressive strain appropriate to increase carrier mobility.

Figure 9:
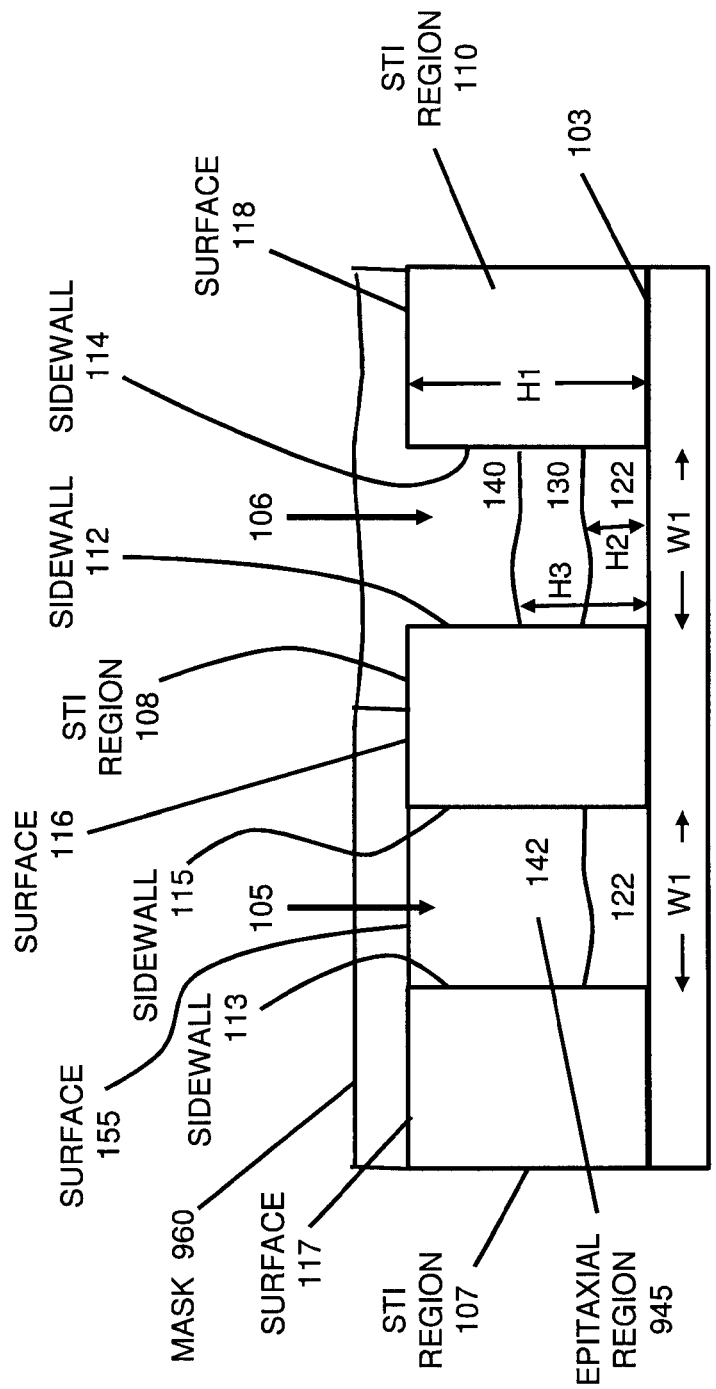
FIG. 9 shows the semiconductor substrate of FIG. 1 after polishing and patterning epitaxial material formed in the first trench, removing the mask from over the second, forming a mask over the first trench, and forming a second and third epitaxial material in the second trench.

FIG. 9 shows the semiconductor substrate of FIG. 1 after polishing and patterning epitaxial material 142 formed in trench 105, removing mask 860, forming mask 960, and forming a second and third epitaxial material in trench 106. In some embodiments, FIG. 9 may also show material 142 polished or planarized to height H1 above surface 103. In some cases polished material 142 has height H1-H2. According to some embodiments, the difference in height between the top of material 122 and the top of polished material 142 may be 100, 200, or 300 nanometers (nm). In some embodiments, materials 122 and/or polished material 142 in the trench, as described above, are referred to as a single region, layer or material. The top surface of material 142 may be polished to form a flat surface having a (100) crystal index above or at a height H1 of top surface 155 of material 142, such as described for FIG. 4. In some cases, after or as a result of polishing, material 142 in trench 105 may be described as epitaxial region 145.

FIG. 9 also shows epitaxial region 945 after removing mask 860 to expose top surface 155. Mask 860 may be etched by a dry etching process that removes the vertical thickness of Mask 860 as described for removing mask 160. In some cases, mask 860 is removed by or during polishing above of material 142 to height H1.

After polishing material 142, FIG. 9 shows pattern or mask 960 formed on top surfaces of polished material 142 in trench 105, and at least a portion of top surfaces 116 and 117. In some cases, mask 960 has width across top surfaces 116 and 117 that is greater than W1, and a height above surface 103 that is greater than H1. Mask 960 may have a length L1. In some cases, mask 960 is formed similar to forming mask 860. Mask 960 may seal off trench 105 and material 142 so that after forming mask 960, material grown or deposited in trench 106 does not enter trench 105 or touch material 142.

FIG. 9 shows a second layer of material 130 epitaxially grown from a top surface of material 122. Material 130 may be grown to height H3 above surface 103. Material 130 may be formed by epitaxial growth (e.g., heteroepitaxy) from material 122, similar to descriptions above for growing material 132 from material 122 for FIG. 3. Material 130 may be epitaxially grown from the crystal surface of material 122 in trench 106 with respect to STI material surfaces 112, 114, 116 and 118, similar to the description above for FIG. 3 and growing material 132 in trench 105 with respect to STI material surfaces 113, 115, 117 and 116, respectively. Material 130 may be a "buffer" layer, such as described for material 132.

FIG. 9 shows a third layer of material 140 epitaxially grown from a top surface of material 132. Material 140 may be grown to height greater than H1 above surface 103. In some cases material 142 have height H1-H3. Material 140 may be formed by epitaxial growth (e.g., heteroepitaxy) from material 130, similar to descriptions above for growing material 142 from material 132 for FIG. 3. Material 140 may be epitaxially grown from the crystal surface of material 130 in trench 106 with respect to STI material surfaces 112, 114, 116 and 118, similar to the description above for FIG. 3 and growing material 142 in trench 105 with respect to STI material surfaces 113, 115, 117 and 116, respectively.

In some cases, material 140 may be a "device" layer, such as a layer on or in which circuitry devices are formed, as known in the art, such as described for material 142. Such devices may include devices described herein. In some cases, material 140 may be a "buffer" layer, such as a layer on or over which a "device" layer will be formed, as known in the art, such as described for material 142.

Material 140 may have a bottom surface having a (100) crystal oriented material grown from material 130, and side surfaces having a (110) crystal oriented material along a direction parallel to sidewalls 112 and 114. In some embodiments, crystaline defects may that existed in material 122 or 130 near or along the sidewalls of the STI do not extend into or to the top of material 140 (e.g., do not extend into height H1 above height H3).

Figure 10:
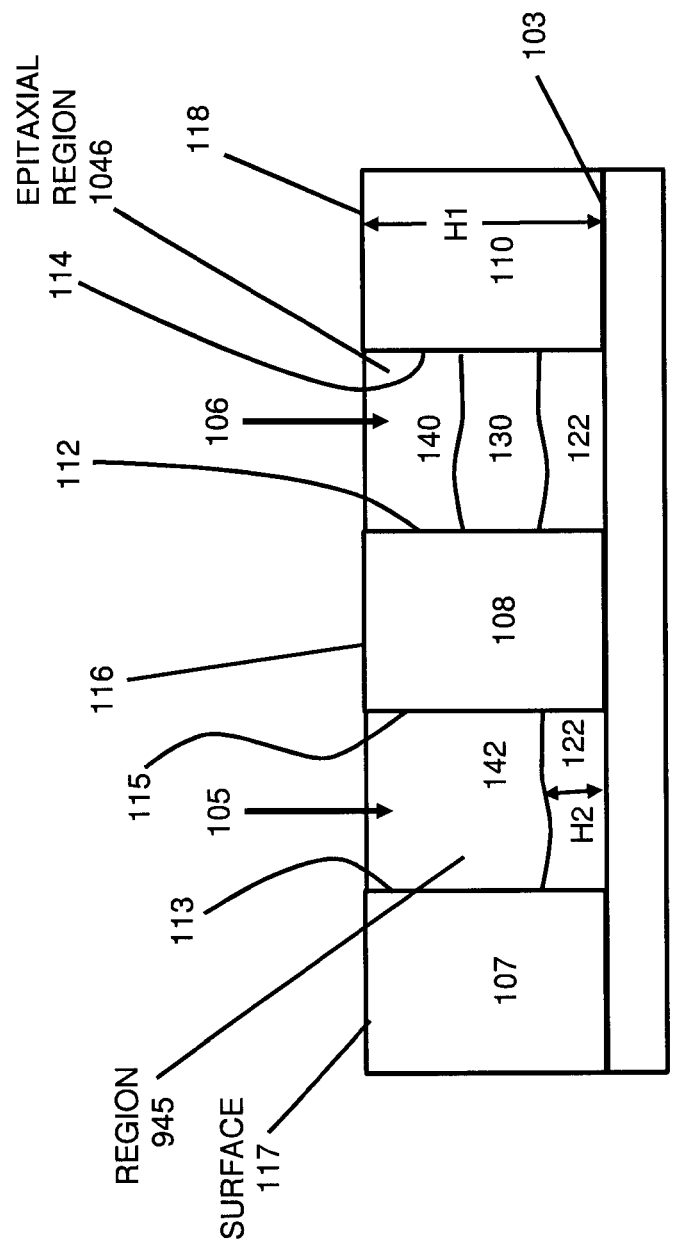
FIG. 10 shows the semiconductor substrate of FIG. 1 after polishing epitaxial material in the second trench and removing the mask over the first trench to form epitaxial region in the second trench.

FIG. 10 shows the semiconductor substrate of FIG. 1 after polishing epitaxial material 140 and removing mask 960 to form epitaxial region 1046. Regions 945 and 1046 may be epitaxially grown regions of a first epitaxial material (e.g., to become a P- or N-type material) on the substrate surface and sidewalls of the trenches 105 and 106 formed between the STI regions. Region 145 and 146 may be described as epitaxially regions that are separately epitaxially grown of a first type of epitaxial material (e.g., p- or n-type) on substrate surface 103 at a bottom of trenches 105 and 106 formed beside (e.g., to the left and right of) shallow trench isolation (STI) region 108.

FIG. 10 shows material 140 polished or planarized to height H1 above surface 103. The top surface of material 140 may be polished to form a flat surface having a (100) crystal index above or at a height H1 of top surface 156 of material 140 such as described for polishing material 142 for FIG. 4. Top surface 156 may have the same height as and be planar with top surfaces 116 or 118. In some cases, after or as a result of polishing, material 140 in trench 106 may be described as epitaxial region 1046.

Polishing or planarizing epitaxial material 140 may be performed by chemical, physical or mechanical polishing as known in the art to form a top planar surface 156 of material 140. Epitaxial region 146 may have W1 and L1, and H1. In some cases, materials 122, 130 and polished 140 may be described as an "epitaxial region"; or a "stack" of epitaxial layers or materials (e.g., after polishing to height H1) similar to embodiments of materials 122, 132 and 142 in region 145, respectively.

In some cases polished material 140 has height H1-H3. According to some embodiments, the difference in height between the top of material 130 and the top of polished material 140 may be 50, 100, or 200 nanometers (nm).

FIG. 10 also shows epitaxial region 945 after removing mask 960 to expose top surface 155. Mask 960 may be etched by a dry etching process that removes the vertical thickness of Mask 960 as described for removing mask 860. In some cases, mask 960 is removed by or during polishing above of material 140 to height H1.

Figure 11:
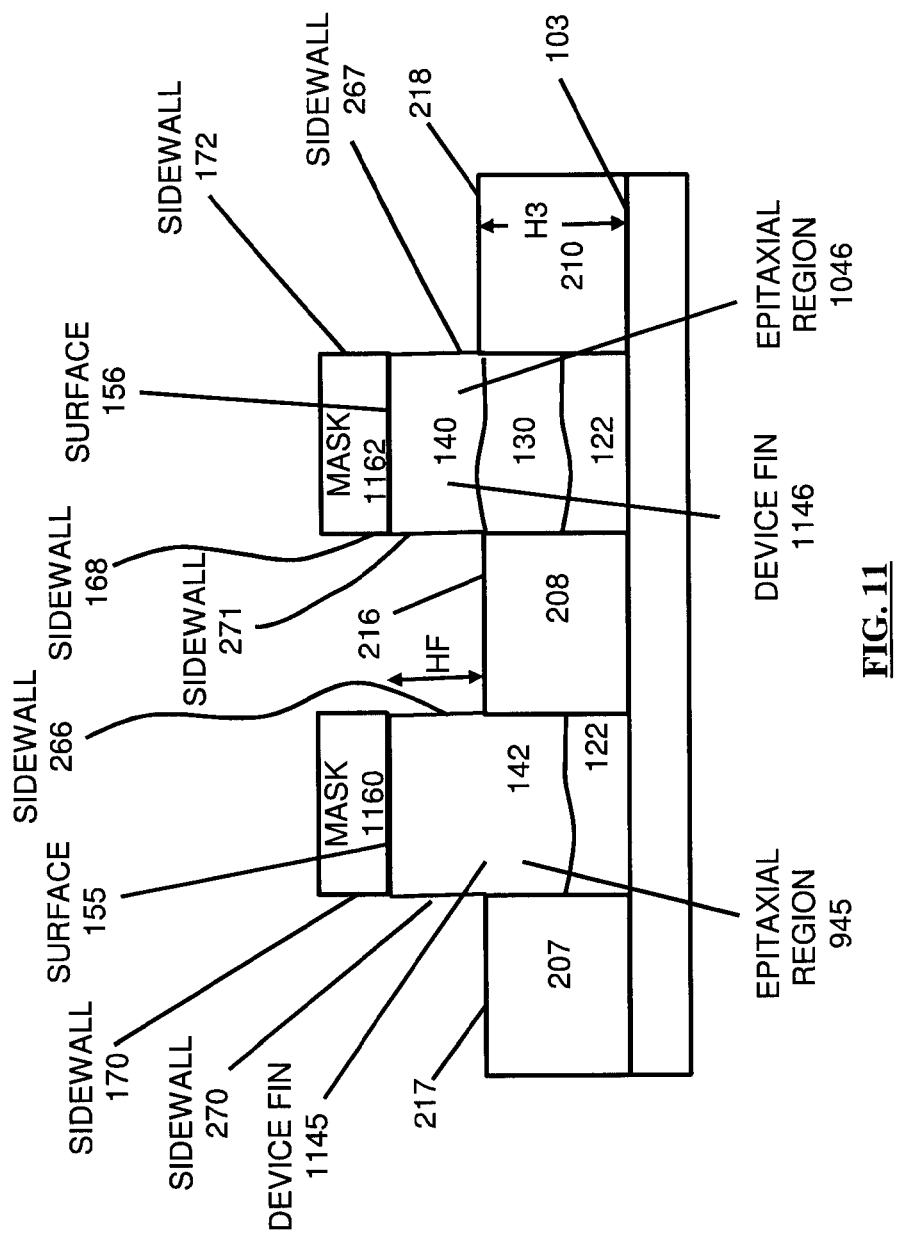
FIG. 11 shows the semiconductor substrate of FIG. 1 after patterning epitaxial material formed in the trenches, and after etching the STI regions to form electronic device fins from a height of the fin layers extending above etched top surfaces of the STI regions.

FIG. 11 shows the semiconductor substrate of FIG. 1 after patterning epitaxial material formed in the trenches, and after etching the STI regions to form electronic device fins from a height of the fin layers (e.g., material 142 and 140) extending above etched top surfaces of the STI regions. FIG. 11 shows pattern or masks 1160 and 1162 formed on top surfaces 155 and 165 of epitaxial regions 945 and 1046. In some cases, masks 1160 and 1162 have width W1 and a height above surfaces 155 and 156. The mask may have a length L1. In some cases, the masks are formed by or of photoresist alone, or a photoresist/oxide combination; or a photoresist/nitride combination.

Masks 160 and 162 may have inner sidewalls 166 and 168 above or adjacent to sidewalls 115 and 112. In some cases, inner sidewalls 166 and 168 may be planar surfaces parallel to and aligned with (e.g., directly above) planar sidewalls 112 and 114. Masks 160 and 162 may also have inner sidewalls 170 and 172 above surfaces 113 and 114. Sidewalls 170 and 172 may be planar surfaces parallel to and above planar sidewalls 113 and 114, such as described for sidewalls 160 and 162 with respect to sidewalls 112 and 115.

According to embodiments, materials 142 and 140 may be patterned (e.g., protected by masks 1160 and 1162), and STI regions 107, 108 and 110 may be etched to form electronic device fins 1145 and 1146 from height HF of the fin layer extending above etched top surfaces 216, 217 and 218 of the STI regions. In some cases, top surfaces 155 and 165 of fin or device materials 142 and 140 are patterned with masks 1160 and 1162, and then top surfaces 116, 117 and 118 are etched to remove thickness (e.g., height HF) of STI regions 108, 107 and 110, to form electronic device fins having height HF of the fin layers extending above the etched top surfaces 216. Fins 1145 and 1146 may each be or include an "exposed" device well or gate layer extending or disposed height HF above the etched STI regions.

Fin 1145 may be an epitaxially grown layer or fin a first epitaxial material (e.g., to become a P- or N-type material) having vertical sidewalls 266 and 270 extending height HF above the etched STI surfaces. Sidewalls 266 and 270 may be planar surfaces parallel to and aligned with (e.g., directly below) planar sidewalls 166 and 170. In some cases, sidewalls 266 and 270 may be planar surfaces parallel to and above planar sidewalls 113 and 115.

Fin 1146 may be an epitaxially grown layer or fin a different, second epitaxial material (e.g., to become a N- or P-type material) having vertical sidewalls 267 and 271 extending height HF above the etched STI surfaces. Sidewalls 267 and 271 may be planar surfaces parallel to and aligned with (e.g., directly below) planar sidewalls 168 and 172. In some cases, sidewalls 267 and 271 may be planar surfaces parallel to and above planar sidewalls 112 and 114.

In some cases, STI regions 107, 108 and 110 are selectively etched with respect to masks 1160 and 1162 to form fins 1145 and 1146. The STI regions may be etched by wet or dry etching to remove material 104 that is not protected by or below the masks. Etching the STI regions may include descriptions above for etching material 104 to form STI regions 107 and 108. In some cases, the STI regions may be etched using a wet etch (e.g., of HF) or a dry etch to remove only or not more than height HF of the material of the STI regions. In some cases, STI regions 107, 108 and 110 are simultaneously etched, such as during processing that simultaneously effects, is applied to, or removes material of those STI regions.

Each of fins 1145 and 1146 may have width W1, height HF above the STI regions, and length L1. In some cases the width W1, height HF and length L1 of the fins are equal to width W1, height H1-H3, and length L1 of region 145.

In some cases, fins 1145 and 1146 may be defined by exposed the top surfaces 155 and 156 (after removal of masks 1160 and 1162); and sidewalls of fins 1145 and 1146.

According to embodiments, the height, length, width and surfaces of top surfaces and sidewalls of fins 1145 and 1146 may be similar to those described for fins 145.

Figure 12:
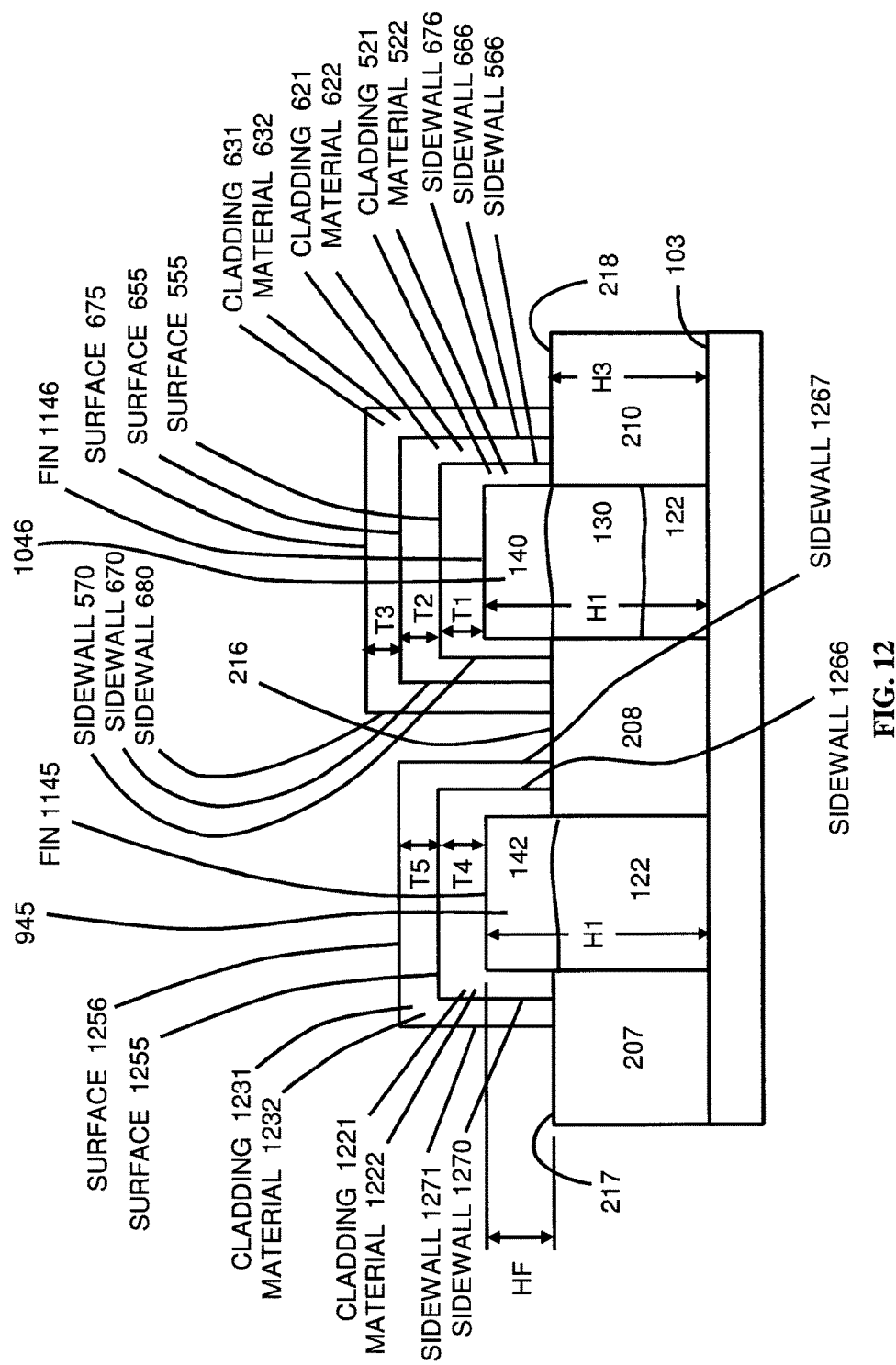
FIG. 12 shows the semiconductor substrate of FIG. 1 after forming conformal thicknesses of conformal epitaxial "cladding" materials grown from sidewall surfaces and a top surface of the electronic device fins.

FIG. 12 shows the semiconductor substrate of FIG. 1 after forming conformal thicknesses of conformal epitaxial "cladding" materials grown from sidewall surfaces and a top surface of the electronic device fins. FIG. 12 shows fins 1145 and 1164 of FIG. 11 after removing masks 1160 and 1162 to expose top surfaces 155 and 156.

The masks may be etched by a process similar to that described for removing mask 160. In some cases, the etch may be a subtractive etch, such as to etch away the masks, with the exception of other materials, such as the STI material and the epitaxial materials (e.g., materials 142 and 140. In some cases, the masks are selectively etched using a wet etch (e.g., of HF) or a dry etch to remove all of the masks.

After removing the masks, FIG. 12 shows fin 1146 after growing conformal thickness T1 of conformal epitaxial "cladding" 521 of expitaxial material 522 from sidewall surfaces 267 and 271, and from top surface 156 of material 140 of the electronic device fin 1146. In some embodiments, material 522 is formed or grown as a "cladding" layer or material grown from sidewall surfaces 267 and 271 to form sidewall surfaces 566 and 570, and from top surface 555, similar to descriptions of FIG. 5 for forming sidewall surfaces 566 and 570; and grown from top surface 155 to form top surface 555. Material 522 (e.g., Sidewall surfaces 566 and 570) may not grow from, but may touch surfaces 216 and 218.

In some cases, a "cladding" material (e.g., material 522) may be "selectively" grown only from a desired single crystal material (e.g., material 140 in this case) but not from other materials similar to descriptions of FIG. 5. According to some embodiments, material 522 may be formed by epitaxial growth (e.g., heteroepitaxy growth) similar to descriptions of FIG. 5. Material 522 may be formed on or touching material 140, to a conformal thickness (e.g., a thickness increasing the "height" on the top surface and "width" on the sidewalls) over fin 1146, similar to descriptions of FIG. 5.

FIG. 12 shows fin 1146 after epitaxially growing conformal thickness T2 of conformal epitaxial "cladding" 621 of expitaxial material 622 from sidewall surfaces 566 and 570, and from top surface 555 of material 522 over electronic device fin 1146. In some embodiments, material 622 is formed or grown from material 522 as described for FIG. 6. Material 622 (e.g., sidewall surfaces 666 and 670) may not grow from, but may touch surfaces 216 and 218. In some cases, material 622 may be defined by exposed the top surface 655; sidewalls 666 and 670 of the epitaxial regions. In some cases, sidewalls 666 and 670 may be planar surfaces parallel to and aligned with (e.g., directly adjacent to and wider than by thickness T2) planar sidewalls 566 and 570. FIG. 12 shows fin 1146 after epitaxially growing conformal thickness T3 of conformal epitaxial "cladding" 631 of expitaxial material 632 from sidewall surfaces 566 and 570, and from top surface 555 of material 522 over electronic device fin 1146.

In some embodiments, material 632 is formed or grown from material 522 as described for FIG. 6. Material 662 (e.g., sidewall surfaces 676 and 680) may not grow from, but may touch surfaces 216 and 218. In some cases, material 632 may be defined by exposed the top surface 655; sidewalls 666 and 670 of the epitaxial regions. In some cases, sidewalls 676 and 680 may be planar surfaces parallel to and aligned with (e.g., directly adjacent to and wider than by thickness T3) planar sidewalls 566 and 570.

After removing the masks, FIG. 12 shows fin 1145 after growing conformal thickness T4 of conformal epitaxial "cladding" 1221 of expitaxial material 1222 from sidewall surfaces 266 and 270, and from top surface 155 of material 142 of the electronic device fin 1145. In some embodiments, material 1222 is formed or grown as a "cladding" layer or material grown from material 142, similar to descriptions of FIG. 5 for growing material 522 from a total length or from portions of the length of material 142. In some embodiments, material 1222 is formed or grown as a "cladding" layer or material grown from sidewall surfaces 266 and 270 to form sidewall surfaces 1266 and 1270, and from top surface 1255, similar to descriptions of FIG. 5 for forming sidewall surfaces 566 and 570; and grown from top surface 155 to form top surface 555. Material 1222 (e.g., Sidewall surfaces 1266 and 1270) may not grow from, but may touch surfaces 216 and 217.

In some cases, a "cladding" material (e.g., material 1222) may be "selectively" grown only from a desired single crystal material (e.g., material 142 in this case) but not from other materials similar to descriptions of FIG. 5. According to some embodiments, material 1222 may be formed by epitaxial growth (e.g., heteroepitaxy growth) similar to descriptions of FIG. 5. Material 1222 may be formed on or touching material 142, to a conformal thickness (e.g., a thickness increasing the "height" on the top surface and "width" on the sidewalls) over fin 1145, similar to descriptions of FIG. 5.

FIG. 12 shows fin 1145 after epitaxially growing conformal thickness T5 of conformal epitaxial "cladding" 1231 of expitaxial material 1232 from sidewall surfaces 1266 and 1270, and from top surface 1255 of material 1222 over electronic device fin 1145. In some embodiments, material 1232 is formed or grown as a "cladding" layer or material grown from material 522, similar to descriptions of FIG. 6 for growing material 622 from a total length or from portions of the length of material 522. Material 1232 (e.g., sidewall surfaces 1266 and 1270) may not grow from, but may touch surfaces 216 and 217. In some cases, material 1322 may be defined by exposed the top surface 1265; sidewalls 1267 and 1271 of the epitaxial regions. In some cases, sidewalls 1267 and 1271 may be planar surfaces parallel to and aligned with (e.g., directly adjacent to and wider than by thickness T5) planar sidewalls 1266 and 1270.

It can be appreciated that the descriptions above (e.g., with respect to FIGS. 7-12) can also be applied to first form mask 860 on trench 105 and form fin 1146 in trench 106; and then form mask 960 over trench 106 (and fin 1146) and form fin 1145 in trench 105.

According to a seventh set of exemplary embodiments, material 122 is a single layer of a "buffer" material having a lattice constant between that of surface 103 and material 132. In these cases, layer 122 is a selectively grown epitaxial layer that is grown from portions of surface 103 in trenches 105 and 106, but not from STI material or surfaces forming the trenches. In these cases, in trench 105, materials 122, 132, 522, and 622 are similar to the descriptions above for the fifth set of embodiments. In these cases, in trench 106, materials 122, 132, 522, 622 and 632 are similar to the descriptions above for the sixth set of embodiments.

According to a ninth set of exemplary embodiments, material 122 is a single layer of a "buffer" material having a lattice constant between that of surface 103 and material 132. In these cases, layer 122 is a selectively grown epitaxial layer that is grown from portions of surface 103 in trenches 105 and 106, but not from STI material or surfaces forming the trenches. In these cases, in trench 105, materials 122, 132, 522, and 622 are similar to the descriptions above for the fifth set of embodiments. In these cases, in trench 106, materials 122, 132, 522, 622 and 632 are similar to the descriptions above for the fourth set of embodiments.

According to another set of exemplary embodiments, material 122 is a single layer of a "buffer" material having a lattice constant between that of surface 103 and material 132. In these cases, layer 122 is a selectively grown epitaxial layer that is grown from portions of surface 103 in trenches 105 and 106, but not from STI material or surfaces forming the trenches. In these cases, in trench 105, materials 122, 132, 522, and 622 are similar to the descriptions above for any of the first through sixth sets of embodiments. In these cases, in trench 106, materials 122, 132, 522, 622 and 632 are similar to the descriptions above for any of the first through sixth sets of embodiments.

Figure 13:
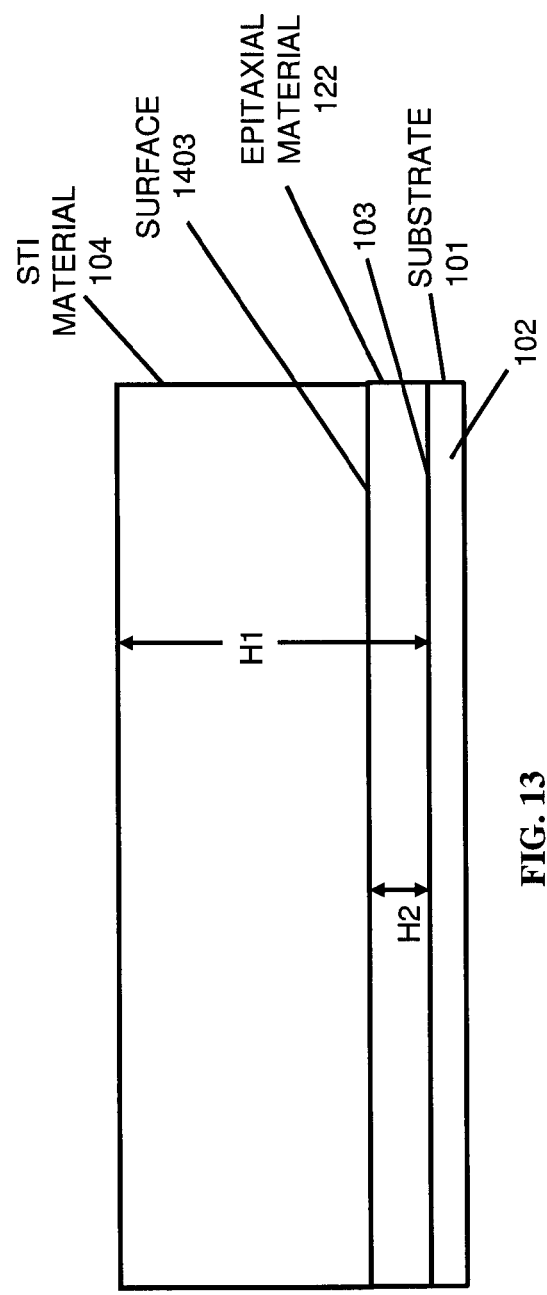
FIG. 13 is a schematic cross section view of a portion of a semiconductor substrate base after forming a layer of epitaxial material on a top surface of the substrate, and a layer of STI material on a top surface of the epitaxial material.

FIG. 13 is a schematic cross section view of a portion of a semiconductor substrate base after forming a layer of epitaxial material on a top surface of the substrate, and a layer of STI material on a top surface of the epitaxial material. FIG. 13 shows semiconductor substrate or base 101 of material 102 having top surface 103.

FIG. 13 shows a first layer of material 122 epitaxially grown from surface 103 as a blanket layer. Material 122 may be epitaxially grown from the crystal surface of substrate surface 103 along all of surface 103, such as described above for growing material 122 in trench 105 for FIG. 3, with the difference being that material 122 is not grown with respect to STI material surfaces 113, 115, 117 and 116. Material 122 may be epitaxially grown prior to forming STI material 104. Material 122 may be grown to height H2. In some cases, material 122 is planarized or polished to height H2 and has a planar top surface.

FIG. 13 also shows a layer of shallow trench isolation (STI) material 104 formed or grown on top surface 1403 of material 122, such as described above for growing material 104 on surface 103 for FIG. 1, with the difference being that material 104 is grown from material 122. Material 104 may be grown to height H1. In some cases, material 122 is planarized or polished to height H1 and has a planar top surface.

In some cases, the bottom surface of material 104 may have the same (100) crystal orientation as that of top surface 1403 of material 122. In some cases, the bottom surface of material 104 may have the same crystal lattice size as that of top surface 1403 of material 122. Material 104 may be a relaxed material (e.g., have a non-strained lattice) with respect to its interface (e.g., where it is chemically or atomically bonded to the surface below) with top surface 1403 of material 122.

Figure 14:
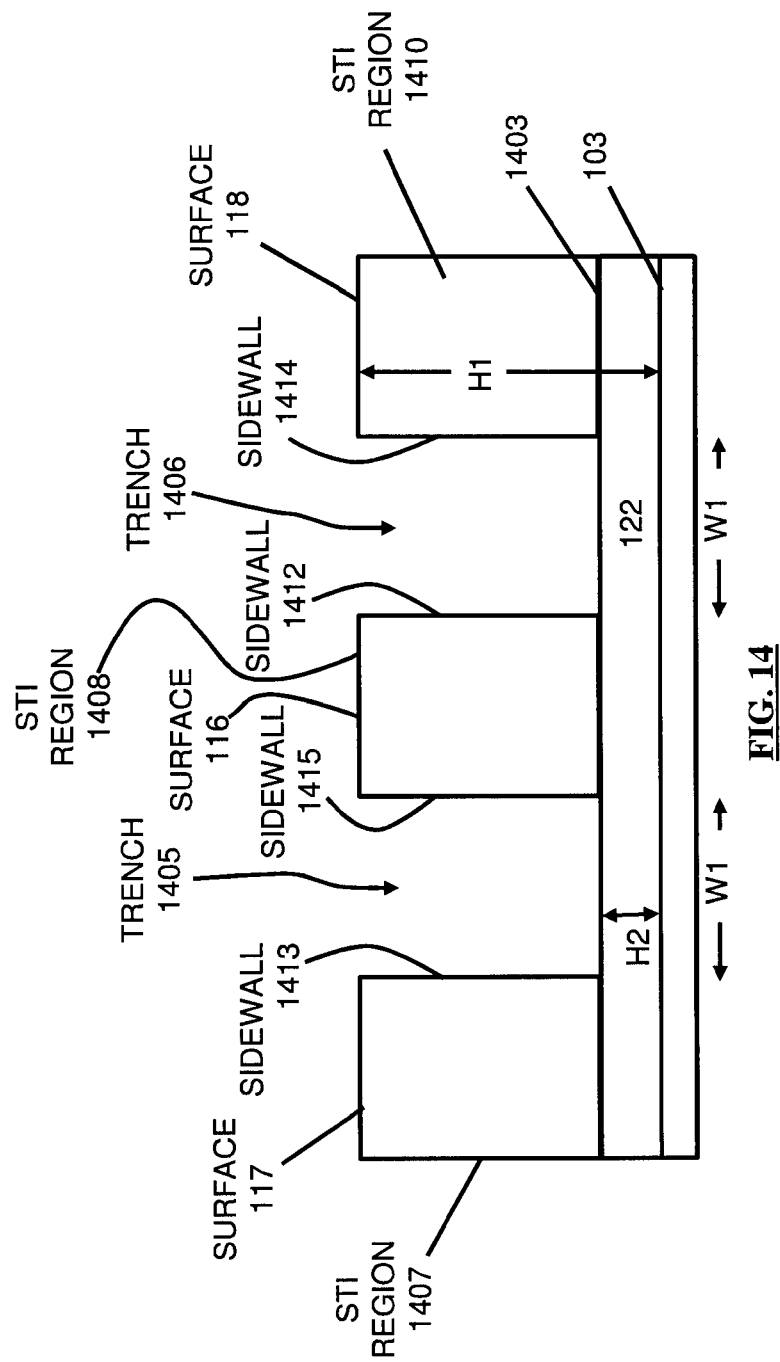
FIG. 14 shows the semiconductor substrate of FIG. 13 after forming trenches between the STI regions.

FIG. 14 shows the semiconductor substrate of FIG. 13 after forming trenches between the STI regions. FIG. 14 shows trenches 1405 and 1406 defined between STI regions 1407, 1408 and 1410 and top surface 1403. These regions and trenches may be formed as described above for forming regions 107, 108 and trench 105, except that material 104 is etched down to surface 1403 of material 122. Such etching may include etching as described for etching material 104 for FIG. 7, but may be selective with respect to (e.g., extend only to) top surface 1403. Trenches 1405 and 1406 may be adjacent trenches that are next to each other without other device fins formed in or within region 108 between trenches 105 and 106.

More specifically, STI region 1407 has sidewall 1413 and top surface 117. STI region 1408 has sidewalls 1412 and 1415, and has top surface 116. STI region 1410 has sidewall 1414 and top surface 118. Sidewalls 1412, 1413, 1414 and 1415 may be vertical planar surfaces perpenticular to (e.g., at a right angle with respect to) horizontal planar surfaces surface 103 and horizontal planar surfaces surfaces 116, 117 and 118. The sidewalls may comprise or be STI material 104. STI regions 1407, 1408 and 1410 may have a width W1 defined by the horizontal distance between their sidewalls. STI regions 1407, 1408 and 1410 may have height H1-H2 defined by the vertical distance between top surface 1403 and top surface 116, 117 and 118, respectively. STI regions 1407, 1408 and 1410 may have a length L1.

Trenches 1405 and 1406 may be defined by the sidewalls of regions 1407, 1408 and 1410; and surface 1403. Trenches 1405 and 1406 may include surface 1403 of material 122 exposed at the bottom of the trench, such as a planar or planarized surface of crystal material. In some cases, each of trenches 1405 and 1406 is defined by additional sidewalls of other STI regions, such as a front and back STI having sidewall similar to sidewalls 1412, 1413, 1414 and 1415, and top surfaces defining length L1 of trenches 1405 and 1406. Trench 1405 and 1406 may have width W1 defined by the horizontal distance between their sidewalls. Trenches 1405 and 1406 may have height H1-H2. Trenches 1405 and 1406 may have a length L1.

FIG. 14 shows trenches 1405 and 1406. However it is contemplated that more, similar trenches and STI regions may exist on substrate 101 (e.g., such as at least hundreds or hundreds of thousands).

Figure 15:
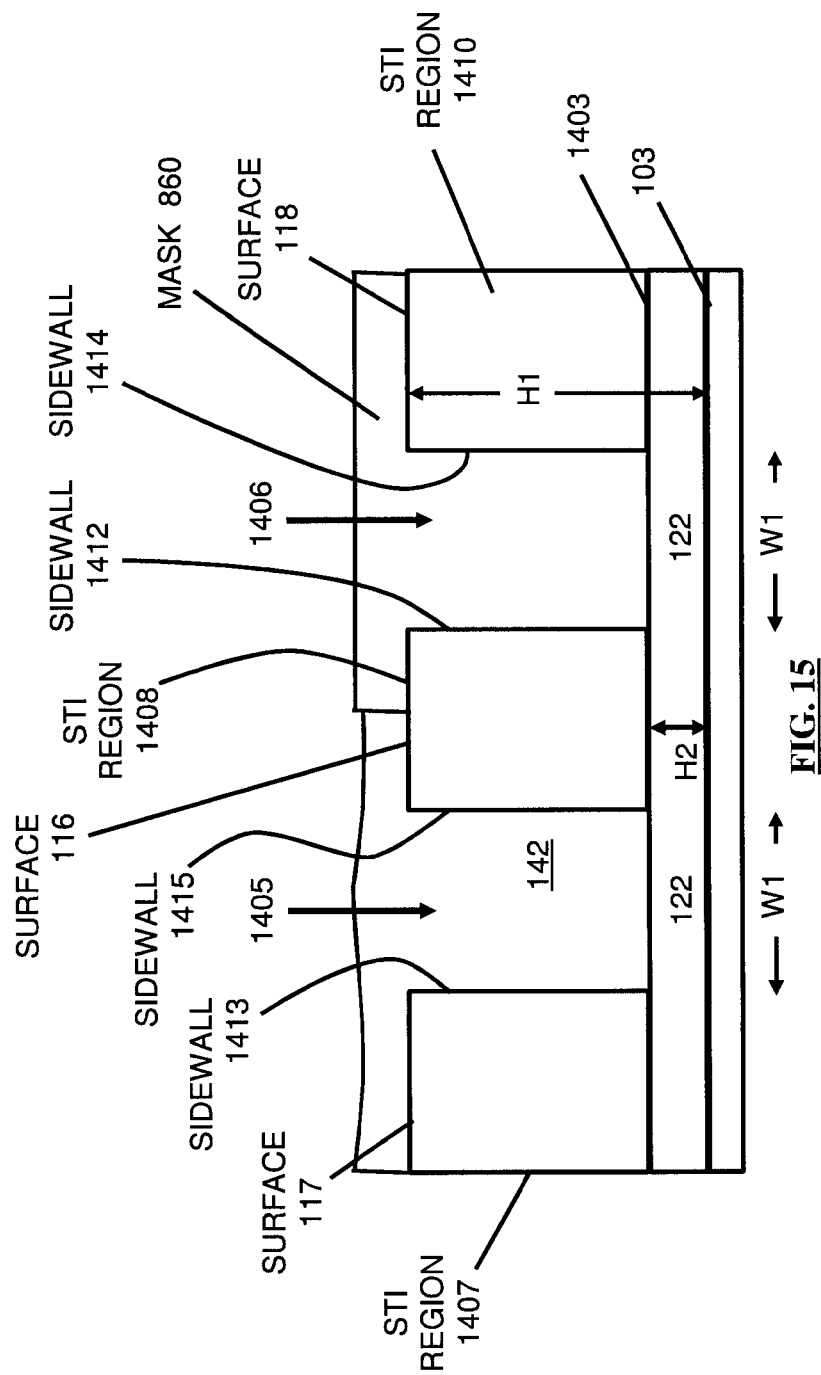
FIG. 15 shows the semiconductor substrate of FIG. 13 after forming a mask over material in the second trench, and forming second epitaxial material in the first trench.

FIG. 15 shows the semiconductor substrate of FIG. 13 after forming a mask over material 122 in trench 1406, and forming second epitaxial material 142 in the trench 1405. FIG. 15 shows pattern or mask 860 formed on top surfaces of material 122 in trench 1406, sidewall surfaces of trench 1406, and at least a portion of top surfaces 116 and 118.

Forming mask 860 on top surfaces of material 122 in trench 1406, sidewall surfaces of trench 1406, and at least a portion of top surfaces 116 and 118 for FIG. 15 may be similar to the description for forming mask 860 on top surfaces of material 122 in trench 106, sidewall surfaces of trench 106, and at least a portion of top surfaces 116 and 118 for FIG. 8. Mask 860 may seal off trench 1406 so that after forming mask 860, material grown or deposited in trench 1405 does not enter trench 1406.

FIG. 15 shows a second layer of material 142 epitaxially grown from a top surface of material 122. Material 142 may be grown to height H3 above surface 1403. Material 142 may be epitaxially grown from the crystal top surface of material 122. Material 142 may be formed by epitaxial growth (e.g., heteroepitaxy) from material 122, similar to descriptions above for growing material 132 from material 122 for FIG. 3. Material 142 may be epitaxially grown from the crystal surface of material 122 in trench 1406 with respect to STI material surfaces 1413, 1415, 116 and 117, similar to the description above for FIG. 8 and growing material 142 in trench 105 with respect to STI material surfaces 113, 115, 117 and 118, respectively.

Figure 16:
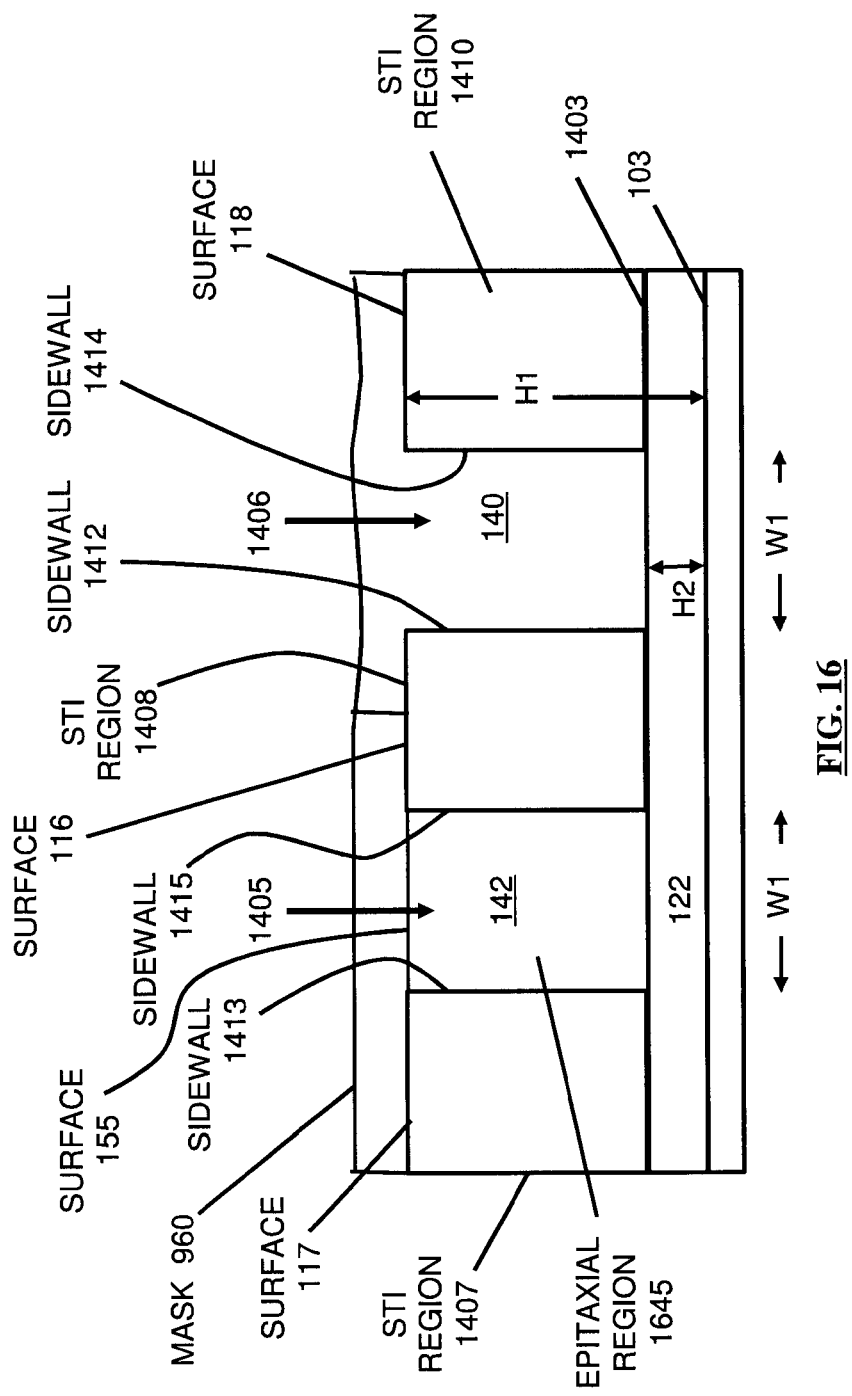
FIG. 16 shows the semiconductor substrate of FIG. 13 after polishing and patterning epitaxial material formed in the first trench, removing the mask from over the second, forming a mask over the first trench, and forming a second and third epitaxial material in the second trench.

FIG. 16 shows the semiconductor substrate of FIG. 13 after polishing and patterning epitaxial material 142 formed in trench 1405, removing mask 860, forming mask 960, and forming a second epitaxial material in trench 1406. In some embodiments, material 142 may be polished or planarized, mask 860 may be removed, and mask 960 may be formed for FIG. 16 similar to the description for FIG. 9.

In some cases, after or as a result of polishing, material 142 in trench 1405 may be described as epitaxial region 1645. Mask 960 may seal off trench 1405 and material 142 so that after forming mask 960, material grown or deposited in trench 1406 does not enter trench 1405 or touch material 142.

FIG. 16 shows a second layer of material 140 epitaxially grown from a top surface of material 122. Material 140 may be grown to height greater than H1 above surface 103. In some cases material 142 have height H1-H3. Material 140 may be formed by epitaxial growth (e.g., heteroepitaxy) from material 122, similar to descriptions above for growing material 142 from material 122 for FIG. 9. Material 140 may be epitaxially grown from the crystal surface of material 122 in trench 1206 with respect to STI material surfaces 1212, 1214, 116 and 118, similar to the description above for FIG. 9 and growing material 142 in trench 105 with respect to STI material surfaces 113, 115, 117 and 116, respectively.

Material 140 may be a "device" layer, such as a layer on or in which circuitry devices are formed, as known in the art, such as described for material 142. Such devices may include devices described herein.

Figure 17:
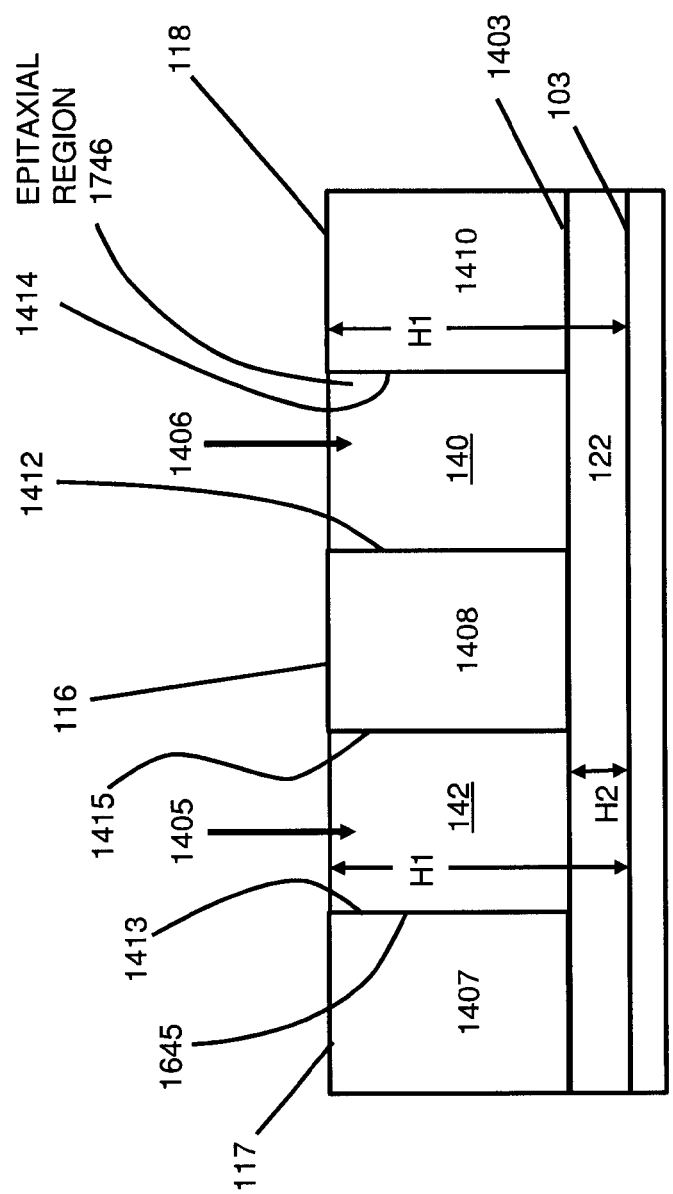
FIG. 17 shows the semiconductor substrate of FIG. 13 after polishing epitaxial material in the second trench and removing the mask over the first trench to form epitaxial region in the second trench.

FIG. 17 shows the semiconductor substrate of FIG. 13 after polishing epitaxial material 140 and removing mask 960 to form epitaxial region 1746. Regions 1645 and 1746 may be epitaxially grown regions of a first epitaxial material (e.g., to become a P- or N-type material) on the substrate surface and sidewalls of the trenches 1405 and 1406 formed between the STI regions. Regions 1745 and 1846 may be described as epitaxially regions that are separately epitaxially grown of a first type of epitaxial material (e.g., p- or n-type) on substrate surface 103 at a bottom of trenches 1405 and 1406 formed beside (e.g., to the left and right of) shallow trench isolation (STI) region 1408.

FIG. 17 shows material 140 polished or planarized to height H1 above surface 103. The top surface of material 140 may be polished to form a flat surface having a (100) crystal index above or at a height H1 of top surface 156 of material 140 such as described for polishing material 142 for FIG. 4. Top surface 156 may have the same height as and be planar with top surfaces 116 or 118. In some cases, after or as a result of polishing, material 140 in trench 106 may be described as epitaxial region 1846.

Polishing or planarizing epitaxial material 140 may be performed by chemical, physical or mechanical polishing as known in the art to form a top planar surface 156 of material 140. Epitaxial region 1846 may have W1 and L1, and H1. In some cases, materials 122 and polished 140 may be described as an "epitaxial region"; or a "stack" of epitaxial layers or materials (e.g., after polishing to height H1) similar to embodiments of materials 122, 132 and 142 in region 145, respectively. In some cases polished material 140 has height H1-H3. According to some embodiments, the difference in height between the top of material 122 and the top of polished material 140 may be 100, 200, or 300 nanometers (nm).

FIG. 17 also shows epitaxial region 1745 after removing mask 960 to expose top surface 155. Mask 960 may be etched by a dry etching process that removes the vertical thickness of Mask 960 as described for removing mask 860. In some cases, mask 960 is removed by or during polishing above of material 140 to height H1.

Figure 18:
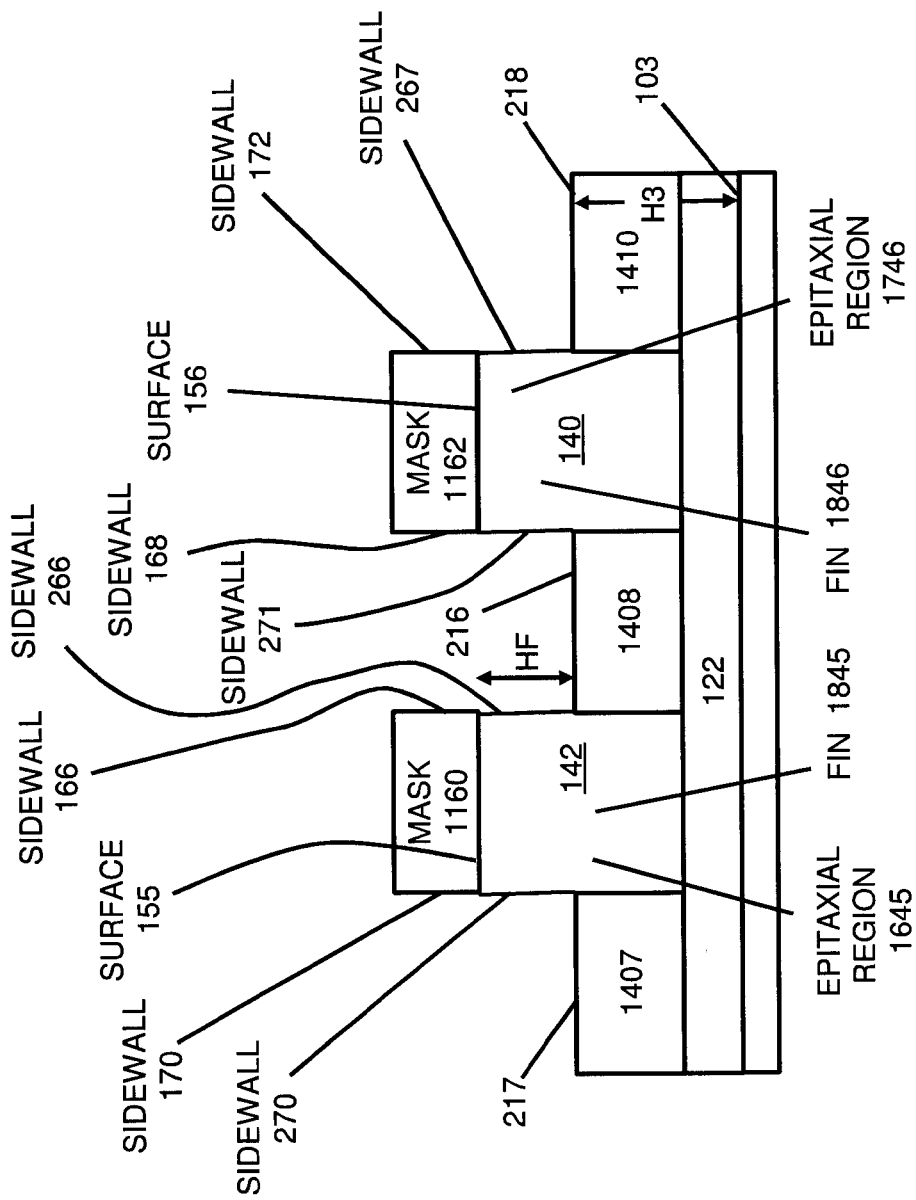
FIG. 18 shows the semiconductor substrate of FIG. 13 after patterning epitaxial material formed in the trenches, and after etching the STI regions to form electronic device fins from a height of the fin layers extending above etched top surfaces of the STI regions.

FIG. 18 shows the semiconductor substrate of FIG. 13 after patterning epitaxial material formed in the trenches, and after etching the STI regions to form electronic device fins from a height of the fin layers (e.g., material 142 and 140) extending above etched top surfaces of the STI regions. FIG. 18 shows pattern or masks 1160 and 1162 formed on top surfaces 155 and 165 of epitaxial regions 1645 and 1746 similar to forming masks 1160 and 1162 formed on top surfaces 155 and 165 of epitaxial regions 945 and 1046 of FIG. 11.

According to embodiments, materials 142 and 140 may be patterned (e.g., protected by masks 1160 and 1162), and STI regions 1407, 1408 and 1410 may be etched to form electronic device fins 1845 and 1846 from height HF of the fin layer extending above etched top surfaces 216, 217 and 218 of the etched STI regions. In some cases, this may be performed similar to the FIG. 11 description for patterning top surfaces 155 and 165 of fin or device materials 142 and 140 with masks 1160 and 1162, and then etching top surfaces 116, 117 and 118 to remove thickness (e.g., height HF) of STI regions 108, 107 and 110, to form electronic device fins having height HF of the fin layers extending above the etched top surfaces 216. Fins 1845 and 1846 may each be or include an "exposed" device well or gate layer extending or disposed height HF above the etched STI regions.

Fin 1845 may be an epitaxially grown layer or fin a first epitaxial material (e.g., to become a P- or N-type material) having vertical sidewalls 266 and 270 extending height HF above the etched STI surfaces. Fin 1846 may be an epitaxially grown layer or fin a different, second epitaxial material (e.g., to become a N- or P-type material) having vertical sidewalls 267 and 271 extending height HF above the etched STI surfaces.

Each of fins 1845 and 1846 may have width W1, height HF above the STI regions, and length L1. In some cases the width W1, height HF and length L1 of the fins are equal to width W1, height H1-H3, and length L1 of region 1645. In some cases, fins 1845 and 1846 may be defined by exposed the top surfaces 155 and 156 (after removal of masks 1160 and 1162); and sidewalls of fins 1845 and 1846. According to embodiments, the height, length, width and surfaces of top surfaces and sidewalls of fins 1845 and 1846 may be similar to those described for fins 1145 and 1146.

Figure 19:
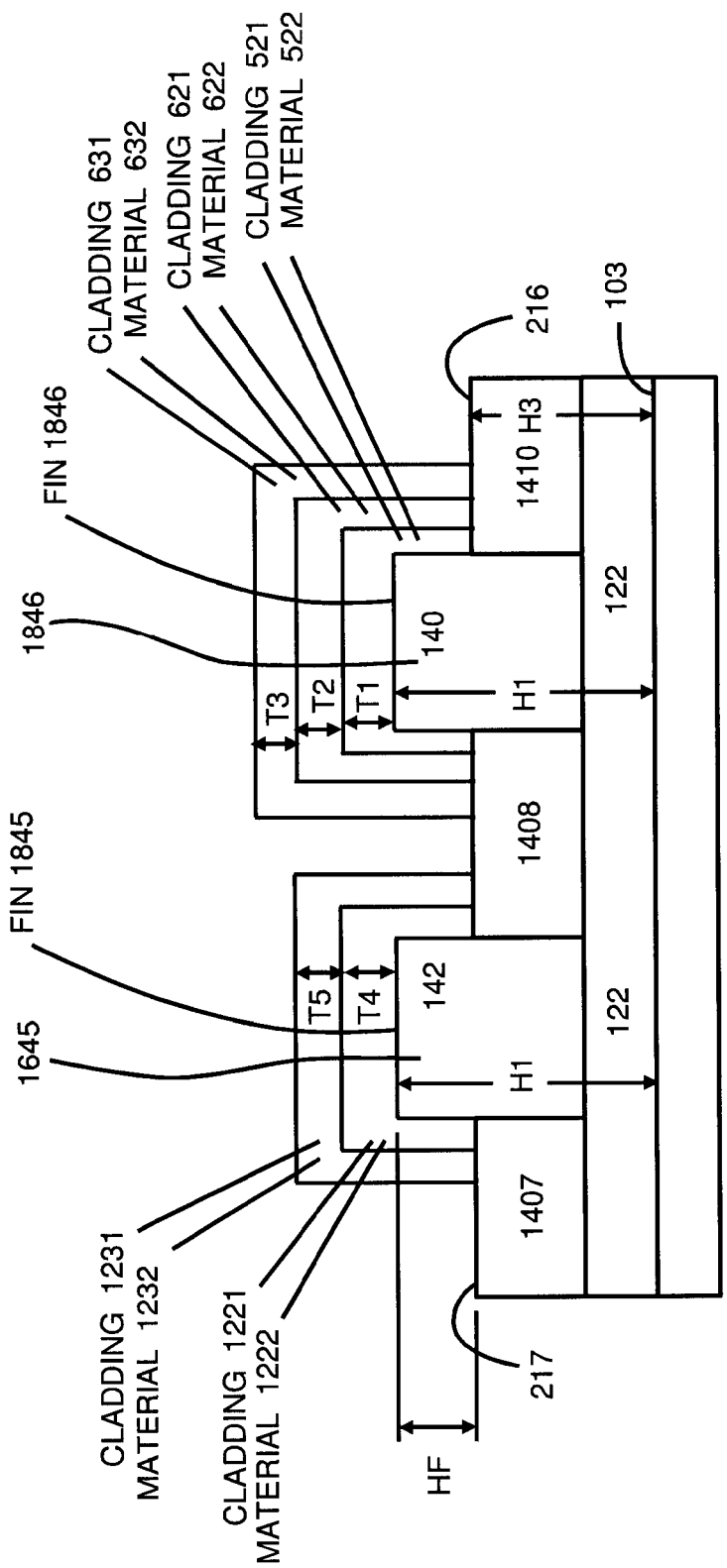
FIG. 19 shows the semiconductor substrate of FIG. 13 after forming conformal thicknesses of conformal epitaxial "cladding" materials grown from sidewall surfaces and a top surface of the electronic device fins.

FIG. 19 shows the semiconductor substrate of FIG. 13 after forming conformal thicknesses of conformal epitaxial "cladding" materials grown from sidewall surfaces and a top surface of the electronic device fins. FIG. 19 shows fins 1845 and 1864 of FIG. 18 after removing masks 1160 and 1162 to expose top surfaces 155 and 156. The masks may be etched by a process similar to that described for removing the masks in FIG. 12.

After removing the masks, FIG. 19 shows fin 1846 after growing conformal thickness T1 of conformal epitaxial "cladding" 521 of expitaxial material 522 from sidewall surfaces 267 and 271, and from top surface 156 of material 140 of the electronic device fin 1846. In some embodiments, material 522 is formed or grown as a "cladding" layer or material grown from sidewall surface and from top surface of material 140, similar to descriptions of FIG. 12.

FIG. 19 shows fin 1846 after epitaxially growing conformal thickness T2 of conformal epitaxial "cladding" 621 of expitaxial material 622 from sidewall surfaces 566 and 570, and from top surface 555 of material 522 over electronic device fin 1846. In some embodiments, material 622 is formed or grown from material 522 as described for FIG. 12.

FIG. 19 shows fin 1846 after epitaxially growing conformal thickness T3 of conformal epitaxial "cladding" 631 of expitaxial material 632 from sidewall surfaces 566 and 570, and from top surface 555 of material 522 over electronic device fin 1846. In some embodiments, material 632 is formed or grown from material 522 as described for FIG. 12.

After removing the masks, FIG. 19 shows fin 1145 after growing conformal thickness T4 of conformal epitaxial "cladding" 1221 of expitaxial material 1222 from sidewall surfaces 266 and 270, and from top surface 155 of material 142 of the electronic device fin 1145. In some embodiments, material 1222 is formed or grown from material 142 as described for FIG. 12.

FIG. 19 shows fin 1845 after epitaxially growing conformal thickness T5 of conformal epitaxial "cladding" 1231 of expitaxial material 1232 from sidewall surfaces 1266 and 1270, and from top surface 1255 of material 1222 over electronic device fin 1845. In some embodiments, material 1232 is formed or grown from material 1222 as described for FIG. 12.

In some cases, According to embodiments, the height, length, width and surfaces of top surfaces and sidewalls of materials 522, 622, 632, 1222 and 1232 in FIG. 19 may be similar to those described for FIG. 12. It can be appreciated that the descriptions above (e.g., with respect to FIGS. 13-19) can also be applied to first form mask 860 on trench 1405 and form fin 1846 in trench 1406; and then form mask 960 over trench 1406 (and fin 1846) and form fin 1845 in trench 1405.

According to an eighth set of exemplary embodiments, material 122 is a single layer of a "buffer" material having a lattice constant between that of surface 103 and material 132. In these cases, layer 122 is a blanket (e.g., non-selective) epitaxial layer grown from all of surface 103 below STI material and two different trenches, prior to forming the STI material of the trenches.

In these cases, in trench 1405, materials 122 (but as a blanket layer at noted above), 142 (e.g., material 132/142), 1222, and 1232 are similar to the descriptions above for the seventh set of embodiments. In these cases, in trench 1406, material 122 (but as a blanket layer at noted above) is similar to the descriptions above for the seventh set of embodiments.

In these cases, material 132 and 142 are the same material (e.g., material 132/142). In these cases, material 132/142 is a buffer material upon which a device material or layer is clad (e.g., as channel material 522). In these cases, material 142 may extend below surfaces 216 and 217, such as where H3 is less than shown in the figures and HF extends below surfaces 216 and 217. In these cases, layer 142 is a device buffer layer of either (1) a layer of InP material (e.g., 50 percent In, and 50 percent P), or (2) a layer of InAlAs material (e.g., 50 percent In, 25 percent Al and 25 percent As) such as for an N-type channel formed of material 522 clad on fin 245. In some cases the layer of InAlAs is 70 percent InAs and 30 percent AlAs; or $In_xAl_{1-x}As$ where x=0.7; or 70% of In and 30% of Al for group III side and 100% for As which is group V material.

In such cases, material 522 is a channel material or layer, such as for a tri-gate device having the channel conducting charges along the sidewall and top material of material 522; material 622 is a gate region or layer (e.g., gate dielectric and gate electrode), such as for a tri-gate device having the gate biasing the conducted charges along the sidewall and top material of material 522; and material 632 includes junction regions or layers on or touching material 522, such as for a tri-gate device having separate source and drain region at or across different portions of length L1 along the sidewall and top material of material 522.

In these cases, material 522 is a cladding layer of doped N-type InGaAs channel material (e.g., 70 percent InAs and 30 percent GaAs; or 70% of In and 30% of Ga for group III side and 100% for As which is group V material; or $In_xGa_{1-x}As$ where x=0.53). In these cases, material 622 is gate dielectric or electrode of InP cladding material (e.g., 50 percent In, and 50 percent P) on or over an N-type channel formed of material 522 clad on fin 245. In these cases, material 632 represents two junction regions of InGaAs material (e.g., 70 percent InAs and 30 percent GaAs; or 70% of In and 30% of Ga for group III side and 100% for As which is group V material; or $In_xGa_{1-x}As$ where x=0.53) as cladding material grown from channel material 142.

According to another set of exemplary embodiments, material 122 is a single layer of a "buffer" material having a lattice constant between that of surface 103 and material 132. In these cases, layer 122 is a blanket (e.g., non-selective) epitaxial layer grown from all of surface 103 below STI material and two different trenches, prior to forming the STI material of the trenches.

In these cases, in trench 1405, materials 122 (but as a blanket layer at noted above), 132, 142, 1222, and 1232 are similar to the descriptions above for any of the first through sixth sets of embodiments. In these cases, in trench 1406, material 122 (but as a blanket layer at noted above), 132, 522, 622 and 632 are similar to the descriptions above for any of the first through sixth sets of embodiments.

Figure 20:
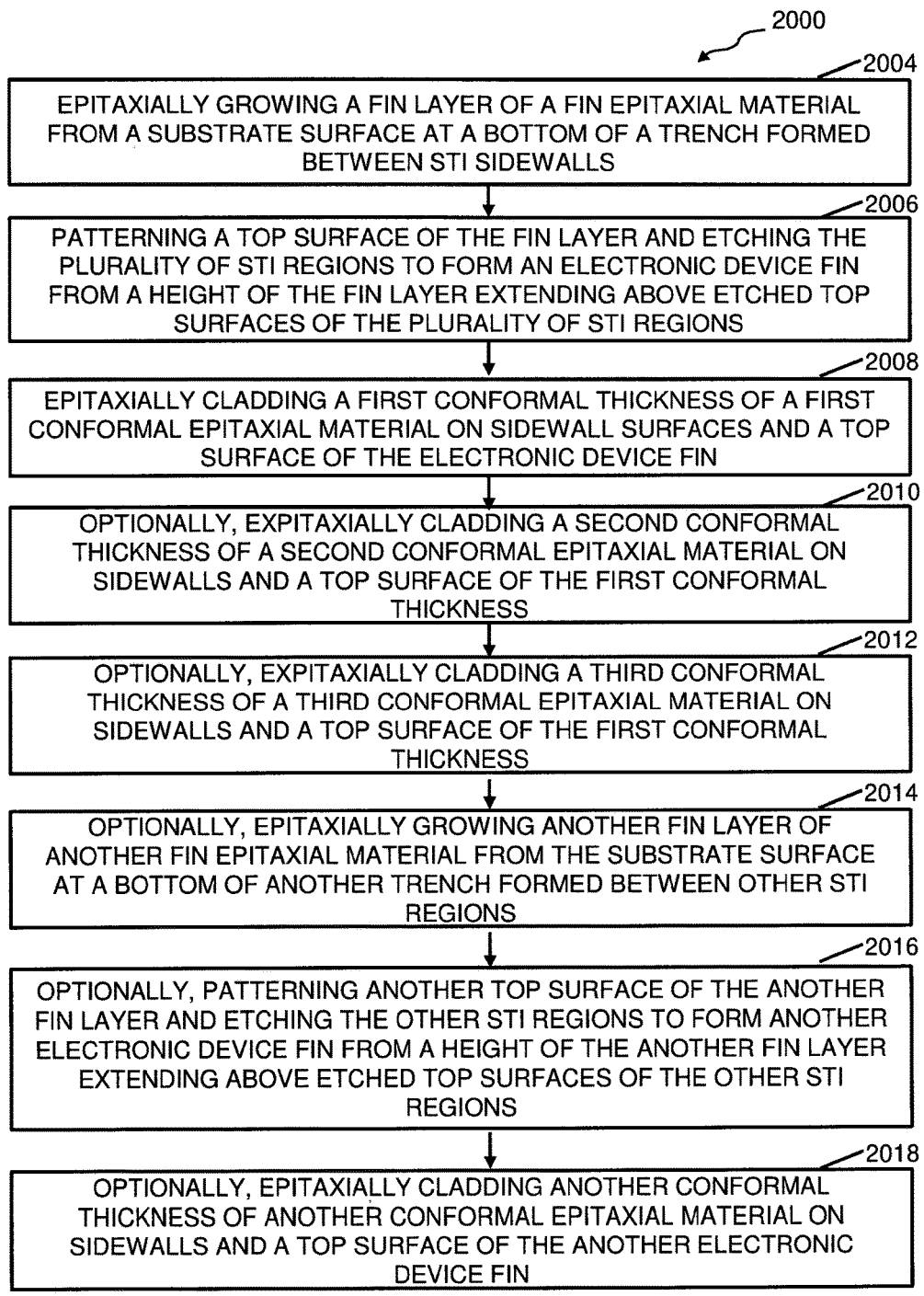
FIG. 20 is an example process for epitaxially cladding a first conformal thickness of a first conformal epitaxial material on sidewall surfaces and a top surface of a single crystal electronic device fin after the fin is epitaxially grown in a trench formed between STI regions, and patterned to form a height of the fin layer.

FIG. 20 is an example process 2000 for epitaxially cladding a first conformal thickness of a first conformal epitaxial material on sidewall surfaces and a top surface of a single crystal electronic device fin after the fin is (1) epitaxially grown from a substrate surface at a bottom of a trench formed between STI regions, and (2) patterned while the STI regions are etched to form a height of the fin layer extending above etched top surfaces of the STI regions. FIG. 20 shows process 2000 beginning with block 2004 where a fin layer of a fin epitaxial material is epitaxially grown from a bottom of a trench formed between shallow trench isolation (STI) sidewalls of STI regions. The fin epitaxial material may include a first, second and third layer of epitaxial materials epitaxially grown on a substrate surface at a bottom of one or two trenches, each formed by a plurality of shallow trench isolation (STI) regions. The STI regions may have STI sidewalls defining a first width W1 and a first height H1 of the trenches. The first height H1 may be at least 1.5 times the first width W1. The substrate surface may be silicon and have a (100) crystal orientation index. This may include forming a fin material in one or more of trenches 105, 106, 1405 and/or 1406 as described herein. Block 2004 may include descriptions herein for forming regions 145, 945, 1046, 1645, and/or 1746 as described herein.

In some optional cases, prior to growing the fin layer, a blanket buffer layer of a blanket buffer epitaxial material is epitaxially grown from a substrate surface; a top surface of the blanket layer forming a bottom of first and second trenches. Here, the first and second fin layers are grown in the first and second trenches from the top surface of the blanket layer. This may include forming a fin in one or more of trenches 1405 and/or 1406 as described herein. This may include descriptions herein for forming regions 1645, and/or 1746 as described herein In some optional cases, prior to growing the fin layer, a STI layer (formed on the substrate or on the optional blanket epitaxial layer) is etched to form the one or two trenches between the STI sidewalls. This may include forming a fin in one or more of trenches 105 and 106; or 1405 and 1406 as described herein. This may include forming regions 945 and 1046; or 1645 and 1746 as described herein At block 2006, a top surface of the fin layer is patterned and the plurality of STI regions are etched to form an electronic device fin from a height of the fin layer extending above etched top surfaces of the plurality of STI regions. This may include forming a fin in one or more of trenches 105, 106, 1405 and/or 1406 as described herein. Block 2006 may include descriptions herein for forming fins 245, 1145, 1146, 1845, and/or 1846 as described herein.

At block 2008, a first conformal thickness of a first conformal epitaxial material is epitaxially clad on sidewall surfaces and a top surface of the electronic device fin. This may include forming cladding material 522, 632, 1222, and/or 1232 as described herein.

At block 2010, in some optional cases, a second conformal thickness of a different second conformal epitaxial material is epitaxially clad on sidewall surfaces and a top surface of the first conformal thickness. This may include forming cladding material 622, 632, 1222, and/or 1232 as described herein.

At block 2012, in some optional cases, a third conformal thickness of a different third conformal epitaxial material is epitaxially clad on sidewall surfaces and a top surface of the first conformal thickness or of the fin material. This may include forming cladding material 632 as described herein.

At block 2014, in some optional cases, another fin layer of another fin epitaxial material is epitaxially grown from a bottom of a second trench formed between shallow trench isolation (STI) sidewalls of STI regions. This may include the descriptions for block 2004 but apply to growing a fin material in a second trench, adjacent to the first trench, as described herein. This may include forming a fin in one or more of trenches 106 and/or 1406 as described herein. Block 2014 may include descriptions herein for forming fins 1146 and/or 1846 as described herein.

At block 2016, in some optional cases, a top surface of the other fin layer is patterned and the plurality of STI regions are etched to form another electronic device fin from a height of the fin layer extending above etched top surfaces of the plurality of STI regions. This may include the descriptions for block 2006 but apply to forming a fin in a second trench, adjacent to the first trench, as described herein. This may include forming a fin in one or more of trenches 106 and/or 1406 as described herein. Block 2016 may include descriptions herein for forming fins 1146 and/or 1846 as described herein.

At block 2018, in some optional cases, another conformal thickness of another conformal epitaxial material is epitaxially clad on sidewall surfaces and a top surface of the other electronic device fin. This may include the descriptions for block 2008 but apply to forming another conformal epitaxial material on another fin in a second trench, adjacent to the first trench, as described herein. This may include forming cladding material 522, 632, 1222, and/or 1232 on another fin in a second trench, adjacent to the first trench, as described herein.

Thus, embodiments have been described herein to provide a more efficient and reliable process for forming both p- and n-type epitaxial electronic device fins from the same substrate by integrating VLSI-compatible fin structures with selective epitaxial growth and fabricating devices thereon. Such integration may include forming or growing different types of P- and N-type material in different, adjacent epitaxial regions grown from the same substrate; and then forming a pair of electronic device fins of the different type material in each for the different epitaxial regions. Thus, the embodiments described herein provide benefits and advantages as compared to other processes and devices, including (1) co-integration of n- and p-mos electronic device fins from epitaxial regions grown from or on the same silicon surface 103 for CMOS implementation (e.g., and within certain length L, width W, and height H requirements as noted herein). Such co-integration of n- and p-mos may include forming of n- and p-mos fins 245, 1145, 1146, 1845, and/or 1846 from the same silicon surface 103 (or 1403) in one or more of trenches 105, 106, 1405 and/or 1406 as described herein. Such co-integration of n- and p-mos may include forming of n- and p-mos regions 145, 945, 1046, 1645, and/or 1746 from the same silicon surface 103 (or 1403) in one or more of trenches 105, 106, 1405 and/or 1406 for both n- and p-mos devices prior to etching both n- and p-mos electronic device fins from those regions.

Some embodiments described herein also provide benefits and advantages as compared to other processes and devices, including (2) a large reduction of defects propagating to the device layers on either or both n- and p-side electronic device fins. In some embodiments, since the defects (e.g., crystaline defects) in trenches 105, 106, 1405 and/or 1406 have not extended into or do not exist in the device material 142 (when material 142 is a channel material), 522, 622, 632, 1222, and/or 1232, the fins (e.g., device material sidewalls and top surfaces) may provide electronic device material (e.g., wells and channels, etc.) in which defect free fin based devices may be formed (e.g., tri-gate devices). For example, by forming electronic device fins (or portions) as described herein, it is possible to avoid or minimize crystaline defects that result in the fins due to or from a large lattice mismatch in materials when certain materials (e.g., type III-V, or type IV (e.g., Ge) materials) are epitaxially grown on a Silicon material substrate, in trenches. Such defects include those trapped or along the sidewall of the STI forming the trenches. By avoiding or minimizing these crystaline defects can lead to yield and variation issues in a device built on a device layer or device sidewall of the fins.

Some embodiments described herein also provide benefits and advantages as compared to other processes and devices, including (3) a large reduction of defects propagating to high K gate layer dielectric material formed on either or both n- and p-side electronic device fins. In some embodiments, since the defects (e.g., crystaline defects) in trenches 105, 106, 1405 and/or 1406 have not extended into or do not exist in the device material 142 (when material 142 is a channel material), 522, 622, 632, 1222, and/or 1232, the high K gate layer dielectric material formed form any of these materials may have reduced broken bonds and/or extra charges, thus providing improved electronic gate dielectric material for fin based devices (e.g., tri-gate devices).

Figure 21:
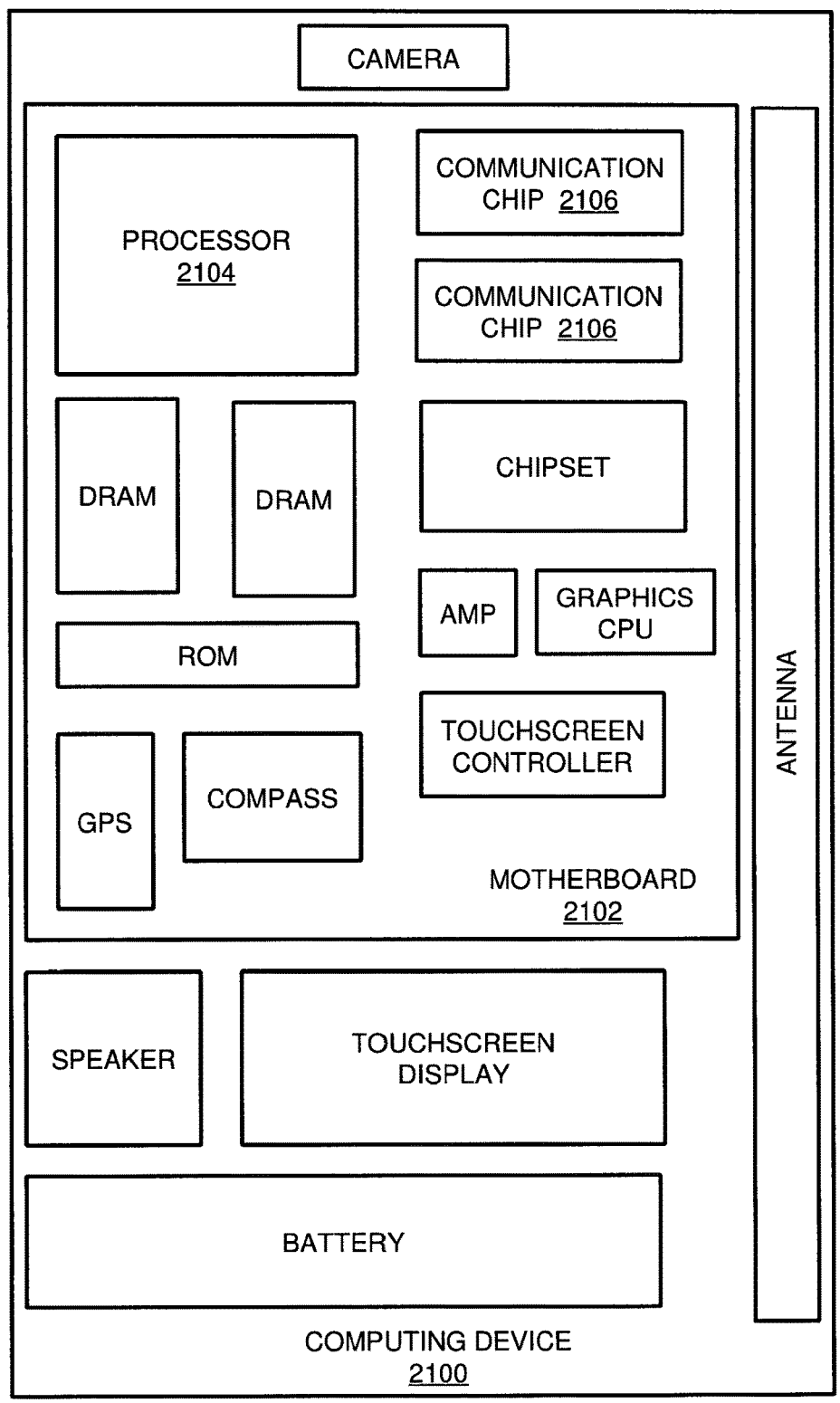
FIG. 21 illustrates a computing device in accordance with one implementation.

FIG. 21 illustrates a computing device 2100 in accordance with one implementation. The computing device 2100 houses board 2102. Board 2102 may include a number of components, including but not limited to processor 2104 and at least one communication chip 2106. Processor 2104 is physically and electrically connected to board 2102. In some implementations at least one communication chip 2106 is also physically and electrically connected to board 2102. In further implementations, communication chip 2106 is part of processor 2104.

Depending on its applications, computing device 2100 may include other components that may or may not be physically and electrically connected to board 2102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 2106 enables wireless communications for the transfer of data to and from computing device 2100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 2106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 2100 may include a plurality of communication chips 2106. For instance, a first communication chip 2106 may be dedicated to shorter range wireless communications such as Wi-Fi and Bluetooth and a second communication chip 2106 may be dedicated to longer range wireless communications such as GPS, EDGE, GPRS, CDMA, WiMAX, LTE, Ev-DO, and others.

Processor 2104 of computing device 2100 includes an integrated circuit die packaged within processor 2104. In some implementations, the integrated circuit die includes epitaxially cladding a first conformal thickness of a first conformal epitaxial material on sidewall surfaces and a top surface of a single crystal electronic device fin after the fin is (1) epitaxially grown from a substrate surface at a bottom of a trench formed between STI regions, and (2) patterned while the STI regions are etched to form a height of the fin layer extending above etched top surfaces of the STI regions as described with reference to FIGS. 1-20. The term "processor" may refer to any device or portion of a device that processes electronic data from registers and/or memory to transform that electronic data into other electronic data that may be stored in registers and/or memory.

Communication chip 2106 also includes an integrated circuit die packaged within communication chip 2106. In accordance with another implementation, a package including a communication chip incorporates one or more fin devices having cladding device layers such as described above. In further implementations, another component housed within computing device 2100 may contain a microelectronic package including a fin device having cladding device layers such as described above.

In various implementations, computing device 2100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 2100 may be any other electronic device that processes data.

EXAMPLES

The following examples pertain to embodiments.

Example 1 is a method to form an electronic device fin comprising: epitaxially growing a fin layer of a fin epitaxial material from a substrate surface at a bottom of a trench formed between a plurality of shallow trench isolation (STI) regions having STI sidewalls defining a first width and a first height of the trench; patterning a top surface of the fin layer and etching the plurality of STI regions to form an electronic device fin from a height of the fin layer extending above etched top surfaces of the plurality of STI regions; and epitaxially cladding a first conformal thickness of a first conformal epitaxial material on sidewall surfaces and a top surface of the electronic device fin.

In Example 2, the subject matter of Example 1 can optionally include wherein epitaxially cladding includes growing the first conformal thickness of a single crystal conformal epitaxial material from the sidewall surfaces and from the top surface of the electronic device fin.

In Example 3, the subject matter of Example 1 can optionally include wherein epitaxially cladding includes growing the first conformal thickness of a single crystal conformal epitaxial material across portions of top surfaces of the plurality of STI regions; but not growing the first conformal thickness of the first conformal epitaxial material from a polycrystaline material of the portions of top surfaces of the plurality of STI regions.

In Example 4, the subject matter of Example 1 can optionally include wherein the fin epitaxial material comprises a device channel material, and the first conformal epitaxial material comprises a gate buffer material formed over a portion of a total length of the channel material.

In Example 5, the subject matter of Example 4 can optionally include wherein the first buffer epitaxial material comprises an ART epitaxial InP or SiGe material; the second buffer epitaxial material comprises an ART epitaxial buffer InAlAs or SiGe material; the device channel material comprises an InGaAs or Ge material; and the first conformal epitaxial material comprises an InP or Si material formed over a portion of a total length of the channel material.

In Example 6, the subject matter of Example 1 can optionally include wherein the fin material comprises a buffer material, and the first conformal epitaxial material comprises a channel material formed over all of a total length of the channel material.

In Example 7, the subject matter of Example 6 can optionally include wherein the first buffer material comprises an epitaxial InP or SiGe material; and the second buffer material comprises an epitaxial buffer InAlAs or SiGe material; and the first conformal epitaxial material comprises an InGaAs or Ge channel material formed over a total length of the channel material.

In Example 8, the subject matter of Example 1 can optionally include further comprising: epitaxially cladding a second conformal thickness of a second conformal epitaxial material on sidewalls and a top surface of the first conformal thickness.

In Example 9, the subject matter of Example 8 can optionally include wherein the fin material comprises one of a buffer material and a device channel material; the first conformal epitaxial material comprises one of a channel material and a gate buffer material; and the second conformal epitaxial material comprises one of a device gate dielectric and a junction region material formed over the first conformal epitaxial material.

In Example 10, the subject matter of Example 8 can optionally include further comprising: epitaxially cladding a third conformal thickness of a third conformal epitaxial material on sidewalls and a top surface of the FIRST conformal thickness.

In Example 11, the subject matter of Example 10 can optionally include wherein the fin material comprises one of a buffer material and a device channel material; the first conformal epitaxial material comprises one of a channel material and a gate buffer material; second conformal epitaxial material comprises a device gate dielectric; and the third conformal epitaxial material comprises a junction region material formed over the first conformal epitaxial material.

In Example 12, the subject matter of Example 1 can optionally include wherein the fin layer is a first fin layer, the fin epitaxial material is a first fin epitaxial material, the trench is a first trench, the plurality of STI regions are a first plurality of STI regions having first STI sidewalls, the top surface of the fin layer is a first top surface, and further comprising: epitaxially growing a second fin layer of a second fin epitaxial material from the substrate surface at a bottom of a second trench formed between a second plurality of STI regions having second STI sidewalls defining the first width and the first height of the second trench; patterning a second buffer top surface of the second fin layer and etching the second plurality of STI regions to form a second electronic device fin from a height of the second fin layer extending above etched top surfaces of the second plurality of STI regions; and epitaxially cladding a second conformal thickness of a second conformal epitaxial material on sidewalls and a top surface of the second electronic device fin.

In Example 13, the subject matter of Example 12 can optionally include wherein the first fin layer comprises a first buffer layer of a first buffer epitaxial material, and a second buffer layer of a second buffer epitaxial material grown from the first buffer epitaxial material in the first trench; wherein the second fin layer comprises the first buffer layer of the first buffer epitaxial material, the second buffer layer of the second buffer epitaxial material grown from the first buffer epitaxial material, and a third buffer layer of a third buffer epitaxial material grown from the second buffer epitaxial material in the second trench; wherein the first conformal epitaxial material comprises a first channel material formed over all of a total length of the second buffer layer over the first trench; and wherein the fourth conformal epitaxial material comprises a different, second channel material formed over all of a total length of the third buffer layer over the second trench.

In Example 14, the subject matter of Example 12 can optionally include further comprising: prior to growing the fin layer, epitaxially growing a blanket buffer layer of a blanket buffer epitaxial material from the substrate surface, a top surface of the blanket layer forming a bottom of the first and second trenches, wherein the first and second fin layers are grown in the first and second trenches from the top surface of the blanket layer; epitaxial growing a second buffer epitaxial material from the top surface of the blanket buffer epitaxial material in the first trench; and epitaxially growing a different, third buffer epitaxial material from the top surface of the blanket buffer epitaxial material in the second trench.

Example 15 is an electronic device fin comprising: a fin layer of a fin epitaxial material on a substrate surface at a bottom of a trench formed between a plurality shallow trench isolation (STI) regions having STI sidewalls defining a first width and a first height of the trench; an electronic device fin comprising a height of the fin layer extending above etched top surfaces of the plurality of STI regions; and a first conformal thickness of a first conformal epitaxial material on sidewalls and a top surface of the electronic device fin.

In Example 16, the subject matter of Example 15 can optionally include wherein the fin epitaxial material epitaxially has a single crystal structure grown from the substrate surface, wherein the first conformal thickness has a single crystal structure grown from the sidewall surfaces and top surface of the electronic device fin, and wherein the first conformal thickness crystal structure is a different atomic structure than a polycrystaline atomic structure of the plurality of STI regions.

In Example 17, the subject matter of Example 15 can optionally include wherein the fin epitaxial material comprises a device channel material, and the first conformal epitaxial material comprises a gate buffer material formed over a portion of a total length of the channel material.

In Example 18, the subject matter of Example 17 can optionally include wherein the fin epitaxial material comprises a buffer material, and the first conformal epitaxial material comprises a channel material formed over all of a total length of the channel material.

In Example 19, the subject matter of Example 15 can optionally include further comprising: a second conformal thickness of a second conformal epitaxial material on sidewalls and a top surface of the first conformal thickness.

In Example 20, the subject matter of Example 15 can optionally include wherein the fin layer is a first fin layer, the fin epitaxial material is a first fin epitaxial material, the trench is a first trench, the plurality of STI regions are a first plurality of STI regions having first STI sidewalls, the top surface of the fin layer is a first top surface, and further comprising: a second fin layer of a second fin epitaxial material on the substrate surface at a bottom of a second trench formed between a second plurality shallow trench isolation (STI) regions having second STI sidewalls defining the first width and the first height of the second trench; a second electronic device fin comprising a second height of the second fin layer extending above etched top surfaces of the second plurality of STI regions; and a second conformal thickness of a second conformal epitaxial material on sidewalls and a top surface of the second electronic device fin.

In Example 21, the subject matter of Example 20 can optionally include further comprising: a blanket buffer layer of a blanket buffer epitaxial material on the substrate surface, a top surface of the blanket layer forming a bottom of the first and second trenches, wherein the first and second fin layers are grown in the first and second trenches from the top surface of the blanket layer; a second buffer epitaxial material on the top surface of the blanket buffer epitaxial material in the first trench; and a different, third buffer epitaxial material on the top surface of the blanket buffer epitaxial material in the second trench.

Example 22 is a system for computing comprising: microprocessor coupled to a memory, the microprocessor having at least one electronic device fin having: a fin layer of a fin epitaxial material on a substrate surface at a bottom of a trench formed between a plurality shallow trench isolation (STI) regions having STI sidewalls defining a first width and a first height of the trench; an electronic device fin comprising a height of the fin layer extending above etched top surfaces of the plurality of STI regions; and a first conformal thickness of a first conformal epitaxial material on sidewalls and a top surface of the electronic device fin.

In Example 23, the subject matter of Example 22 can optionally include wherein the fin epitaxial material epitaxially has a single crystal structure grown from the substrate surface, wherein the first conformal thickness has a single crystal structure grown from the sidewall surfaces and top surface of the electronic device fin, and wherein the first conformal thickness crystal structure is a different atomic structure than a polycrystalline atomic structure of the plurality of STI regions.

In Example 24, the subject matter of Example 22 can optionally include further comprising: a second conformal thickness of a second conformal epitaxial material on sidewalls and a top surface of the first conformal thickness.

Example 25 is an apparatus comprising means for performing the method of any one of claims 1-14.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit embodiments of the invention but to illustrate it. The scope of the embodiments of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects of embodiments. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe forming fin 1145 adjacent to fin 1146; and fin 1845 adjacent to fin 1846, the descriptions and figures above can be applied to forming any of those fins adjacent to any of those fins (e.g., including 1145 adjacent to fin 1145). Thus, the claims following the Detailed Description are hereby expressly incorporated into this Detailed Description, with each claim standing on its own as a separate embodiment of the invention.

The invention claimed is:

1. An integrated circuit structure, comprising:
   an insulating layer having a trench therein;
   a semiconductor fin having a lower fin portion in the trench and an upper fin portion extending above the insulating layer, wherein the lower fin portion comprises a first semiconductor material, the upper fin portion having a top and sidewalls and comprising a second semiconductor material, and wherein the second semiconductor material meets the first semiconductor material at a non-planar interface; and
   a third semiconductor material directly on the top and sidewalls of the upper fin portion and on a portion of the insulating layer, wherein the second semiconductor material is different than the first and third semiconductor materials.

2. The integrated circuit of claim 1, further comprising:
   a fourth semiconductor material on the third semiconductor material on the top and sidewalls of the upper fin portion and on a second portion of the insulating layer.

3. The integrated circuit of claim 1, further comprising:
   a fourth semiconductor material in the trench, the first semiconductor material on the fourth semiconductor material, and the fourth semiconductor material different from the first semiconductor material.

4. The integrated circuit of claim 3, wherein the fourth semiconductor material meets the first semiconductor material at a second non-planer interface.

5. The integrated circuit of claim 1, further comprising:
   a fourth semiconductor material on the third semiconductor material on the top and sidewalls of the upper fin portion and on a second portion of the insulating layer; and
   a fifth semiconductor material in the trench, the first semiconductor material on the fifth semiconductor material, and the fifth semiconductor material different from the first semiconductor material.

6. The integrated circuit of claim 5, wherein the fifth semiconductor material meets the first semiconductor material at a second non-planar interface.

7. The integrated circuit of claim 1, wherein the trench exposes a portion of an underlying single crystal silicon substrate.

8. The integrated circuit of claim 1, wherein the third semiconductor material comprises germanium.

9. The integrated circuit of claim 1, wherein the third semiconductor material comprises a III-V material.

10. The integrated circuit of claim 1, further comprising:
    A gate electrode over a portion of the third semiconductor material.

11. A method of fabricating an integrated circuit structure, the method comprising:
    forming an insulating layer having a trench therein;
    forming a semiconductor fin having a lower fin portion in the trench and an upper fin portion extending above the insulating layer, wherein the lower fin portion comprises a first semiconductor material, the upper fin portion having a top and sidewalls and comprising a second semiconductor material, and wherein the second semiconductor material meets the first semiconductor material at a non-planar interface; and
    forming a third semiconductor material directly on the top and sidewalls of the upper fin portion and on a portion of the insulating layer, wherein the second semiconductor material is different than the first and third semiconductor materials.

12. The method of claim 11, further comprising:
    forming a fourth semiconductor material on the third semiconductor material on the top and sidewalls of the upper fin portion and on a second portion of the insulating layer.

13. The method of claim 11, further comprising:
    forming a fourth semiconductor material in the trench, the first semiconductor material on the fourth semiconductor material, and the fourth semiconductor material different from the first semiconductor material.

14. The method of claim 13, wherein the fourth semiconductor material meets the first semiconductor material at a second non-planar interface.

15. The method of claim 11, further comprising:
    forming a fourth semiconductor material on the third semiconductor material on the top and sidewalls of the upper fin portion and on a second portion of the insulating layer; and
    forming a fifth semiconductor material in the trench, the first semiconductor material on the fifth semiconductor material, and the fifth semiconductor material different from the first semiconductor material.

16. The method of claim 15, wherein the fifth semiconductor material meets the first semiconductor material at a second non-planar interface.

17. The method of claim 11, wherein the trench exposes a portion of an underlying single crystal silicon substrate.

18. The method of claim 11, wherein the third semiconductor material comprises germanium.

19. The method of claim 11, wherein the third semiconductor material comprises a III-V material.

20. The method of claim 11, further comprising:
    forming a gate electrode over a portion of the third semiconductor material.

* * * * *